(12) United States Patent
Han et al.

(10) Patent No.: US 11,309,354 B2
(45) Date of Patent: Apr. 19, 2022

(54) THREE-DIMENSIONAL NONVOLATILE MEMORY DEVICE HAVING RESISTANCE CHANGE STRUCTURE AND METHOD OF OPERATING THE SAME

(71) Applicant: SK hynix Inc., Icheon-si (KR)

(72) Inventors: Jae Hyun Han, Icheon-si (KR); Se Ho Lee, Yongin-si (KR); Hyangkeun Yoo, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 16/908,635

(22) Filed: Jun. 22, 2020

(65) Prior Publication Data

US 2021/0202577 A1 Jul. 1, 2021

(30) Foreign Application Priority Data

Dec. 30, 2019 (KR) ........................ 10-2019-0178753

(51) Int. Cl.
*H01L 27/24* (2006.01)
*G11C 13/00* (2006.01)
(Continued)

(52) U.S. Cl.
CPC .............. *H01L 27/249* (2013.01); *G11C 5/06* (2013.01); *G11C 13/003* (2013.01); *G11C 13/0007* (2013.01); *G11C 13/0011* (2013.01); *G11C 13/0069* (2013.01); *H01L 27/2454* (2013.01); *H01L 45/08* (2013.01); *H01L 45/085* (2013.01); *H01L 45/142* (2013.01); *H01L 45/143* (2013.01); *H01L 45/144* (2013.01); *H01L 45/146* (2013.01); *H01L 45/147* (2013.01); *G11C 2013/0071* (2013.01); *G11C 2213/71* (2013.01); *G11C 2213/75* (2013.01); *G11C 2213/79* (2013.01)

(58) Field of Classification Search
CPC ... H01L 27/249; H01L 27/2454; H01L 45/08; H01L 45/085; H01L 45/142; H01L 45/143; H01L 45/144; H01L 45/146; H01L 45/147; G11C 5/06; G11C 13/0007; G11C 13/0011; G11C 13/003; G11C 13/0069

See application file for complete search history.

(56) References Cited

U.S. PATENT DOCUMENTS 9,159,919 B2 10/2015 Lee et al.
2015/0270483 A1 9/2015 Seong et al.
(Continued)

*Primary Examiner* — Jerome Leboeuf

(57) ABSTRACT

A nonvolatile memory device includes a substrate having an upper surface and a channel structure disposed over the substrate. The channel structure includes at least one channel layer pattern and at least one interlayer insulation layer pattern, which are alternately stacked in a first direction perpendicular to the upper surface, and the channel structure extends in a second direction perpendicular to the first direction. The nonvolatile memory device includes a resistance change layer disposed over the substrate and on at least a portion of one sidewall surface of the channel structure, a gate insulation layer disposed over the substrate and on the resistance change layer, and a plurality of gate line structures disposed over the substrate, each contacting a first surface of the gate insulation layer and disposed to be spaced apart from each other in the second direction.

17 Claims, 16 Drawing Sheets

(51) Int. Cl.
*H01L 45/00* (2006.01)
*G11C 5/06* (2006.01)

(56) References Cited

U.S. PATENT DOCUMENTS

2017/0077184 A1* 3/2017 Kikuchi ................ H01L 27/249
2017/0194446 A1* 7/2017 Lee ..................... H01L 29/7827
2019/0067374 A1* 2/2019 Franca-Neto ..... H01L 27/10891
2020/0395408 A1* 12/2020 Takahashi ............. H01L 45/144

* cited by examiner

THREE-DIMENSIONAL NONVOLATILE MEMORY DEVICE HAVING RESISTANCE CHANGE STRUCTURE AND METHOD OF OPERATING THE SAME

CROSS-REFERENCE TO RELATED APPLICATIONS

The present application claims priority under 35 U.S.C. § 119(a) to Korean Application No. 10-2019-0178753, filed on Dec. 30, 2019, which is incorporated herein by references in its entirety.

BACKGROUND

1. Technical Field

The present disclosure generally relates to a nonvolatile memory device and, more particularly, to a three-dimensional nonvolatile memory device having a resistance change structure and a method of operating the same.

2. Related Art

Due to trends in semiconductor devices that include decreasing design rules and increasing the degree of integration, research has continued on the structures of semiconductor devices that can guarantee both the structural stability and reliability of signal storage operations. Currently, a nonvolatile memory device such as a flash memory employing a three-layer stacked structure including a charge tunneling layer, a charge trap layer, and a charge barrier layer as a charge storage structure has been widely utilized.

Recently, various nonvolatile memory devices having structures different from existing flash memory devices have been proposed. An example of a nonvolatile memory device is a resistance change memory device. While a flash memory device implements a memory function through charge storage, a resistance change memory device has a memory layer in a memory cell with a variable resistance state between a high resistance state and a low resistance state, and stores the changeable resistance states in a nonvolatile manner, thereby writing predetermined signal information in the memory cell.

SUMMARY

A nonvolatile memory device according to an aspect of the present disclosure may include a substrate having an upper surface and a channel structure disposed over the substrate. The channel structure may include at least one channel layer pattern and at least one interlayer insulation layer pattern, which are alternately stacked in a first direction perpendicular to the upper surface, and the channel structure extends in a second direction perpendicular to the first direction. In addition, the nonvolatile memory device may include a resistance change layer disposed over the substrate and on at least a portion of one sidewall surface of the channel structure. In addition, the nonvolatile memory device may include a gate insulation layer disposed over the substrate and on the resistance change layer, and a plurality of gate line structures disposed over the substrate along the first direction each contacting a first surface of the gate insulation layer. The plurality of gate line structures may be disposed to be spaced apart from each other in the second direction.

A nonvolatile memory device according to another aspect of the disclosure may include a substrate having an upper surface and a first channel structure and a second channel structure disposed over the substrate. Each of the first and second channel structures may include at least one channel layer pattern and at least one interlayer insulation layer pattern, which are alternately stacked in a first direction perpendicular to the upper surface, and each of the first and second channel structures may extend in a second direction perpendicular to the first direction and the first and second channel structures are spaced apart from each other in a third direction perpendicular to the first and second directions. The nonvolatile memory device may include a first resistance change layer and a first gate insulation layer sequentially disposed on a sidewall surface of the first channel structure along the third direction. The nonvolatile memory device may include a second resistance change layer and a second gate insulation layer sequentially disposed on a sidewall surface of the second channel structure along the third direction. The nonvolatile memory device may include a plurality of gate line structures disposed over the substrate and disposed between the first channel structure and the second channel structure. The plurality of gate line structures may be spaced apart from each other and extend in the first direction.

There is disclosed a method of operating a nonvolatile memory device according to another aspect of the disclosure. A nonvolatile memory device including a substrate, a channel structure including at least one channel layer pattern disposed along a first direction perpendicular to an upper surface of the substrate, a resistance change layer disposed over the substrate to cover one sidewall surface of the channel structure, a gate insulation layer that are disposed over the substrate and on the resistance change layer, and a plurality of gate line structures disposed over the substrate to be spaced apart from each other along a second direction perpendicular to the first direction and each of the plurality of gate line structures contacting the gate insulation layer may be provided. A first memory cell for a set operation may be determined from among a plurality of memory cells of the nonvolatile memory device. A gate voltage may be applied to the plurality of gate line structures to form a conductive channel in a channel layer pattern of the at least one channel structure. The gate voltage applied to one of the plurality of gate line structures corresponding the first memory cell from among the plurality of gate line structures may be removed to disconnect a first portion of the conductive channel formed in the channel layer pattern that overlaps the corresponding one of the gate line structure. A set voltage may be applied to the ends of the channel layer pattern corresponding to the first memory cell.

DETAILED DESCRIPTION

Figure 1:
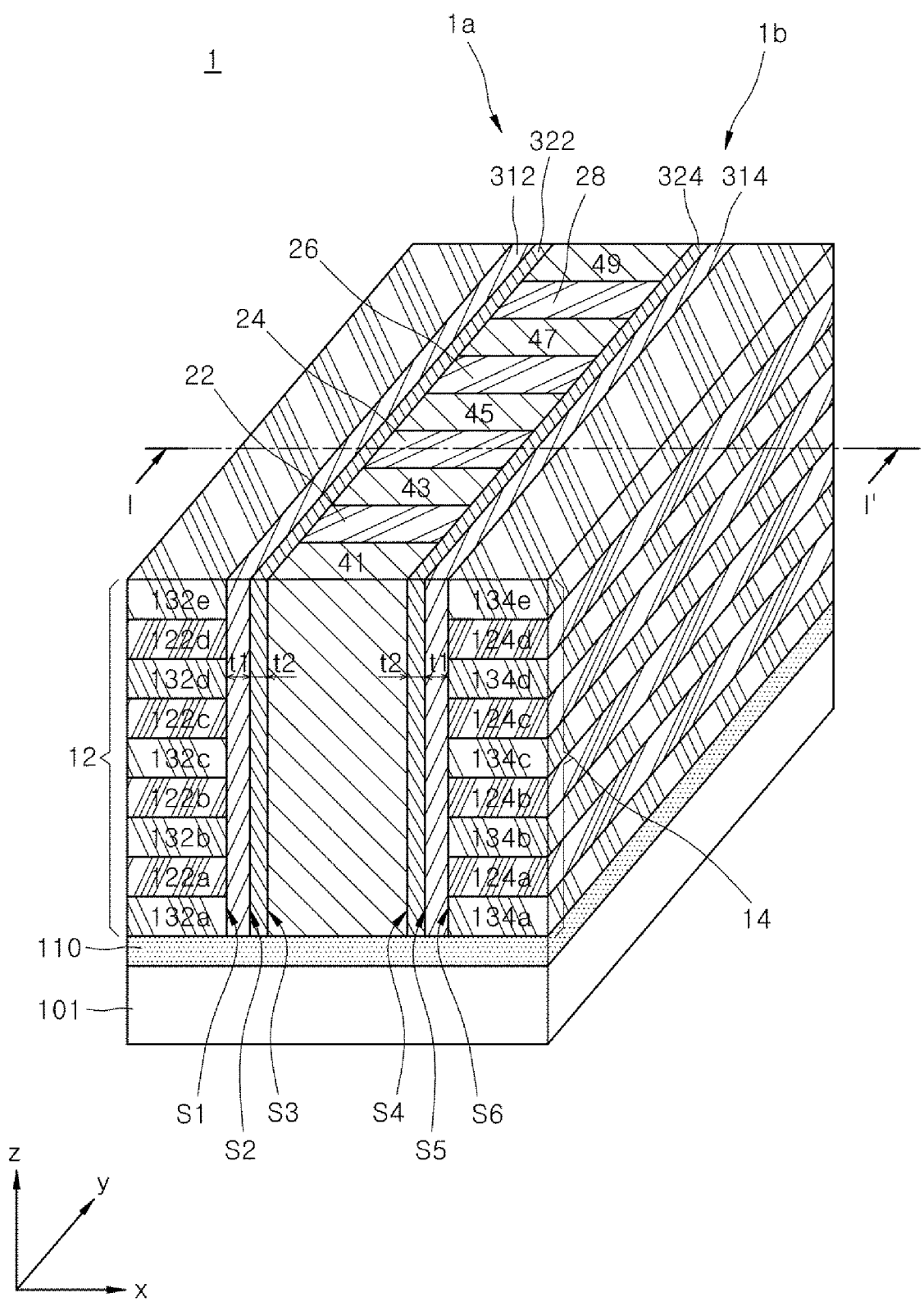
FIG. 1 is a perspective view illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the z-direction may encompass a direction parallel to the z-direction. That is, the z-direction may mean all of a direction in which an absolute value of the z-axis increases in a positive direction along the z-axis from the origin 0 and a direction in which an absolute value of the z-axis increases in a negative direction along the z-axis from the origin 0.

The x-direction and the y-direction may each be interpreted in substantially the same way in the x-y-z coordinate system.

Figure 2:
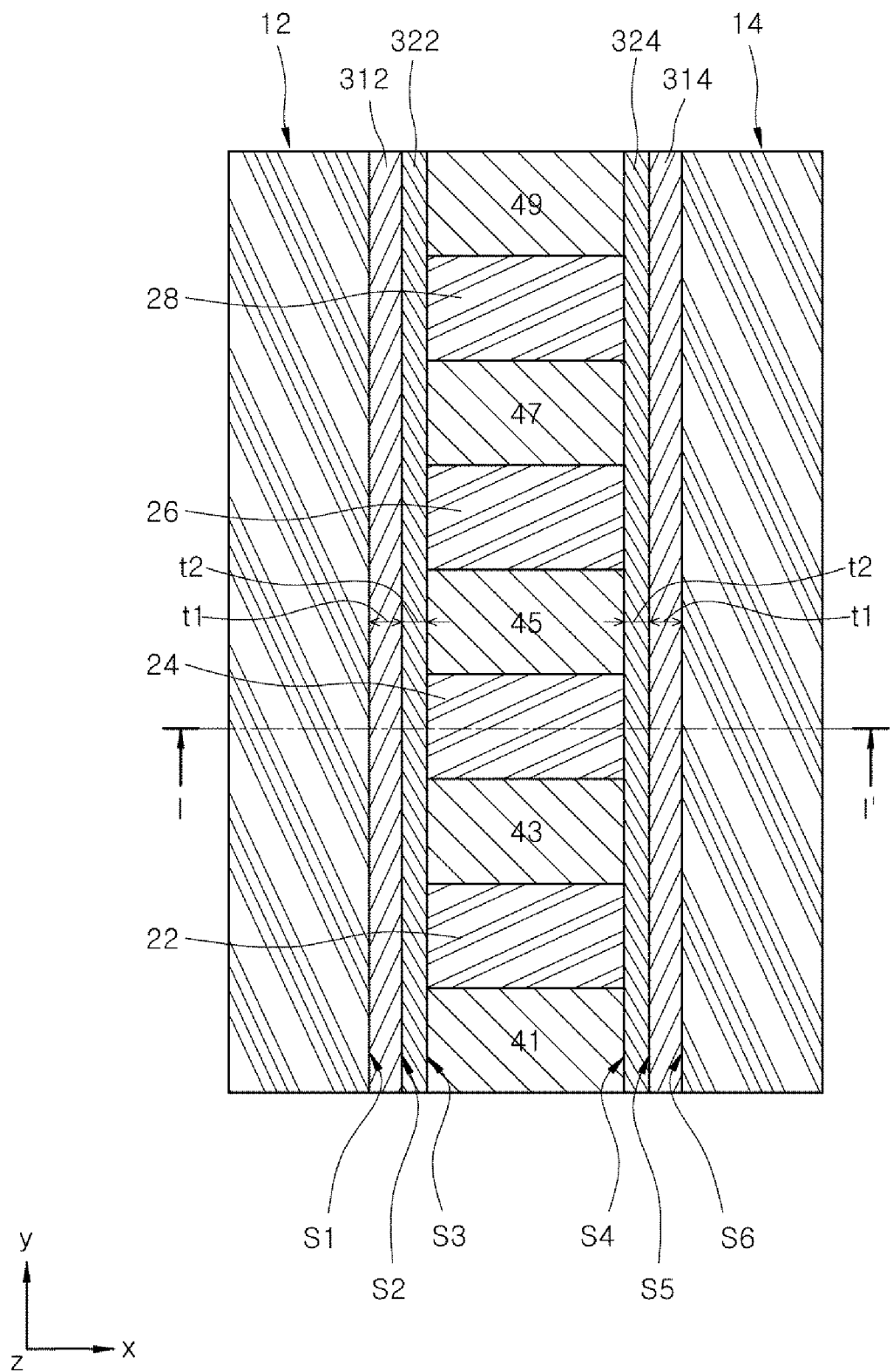
FIG. 2 is a plan view of the nonvolatile memory device of FIG. 1.
Figure 3:
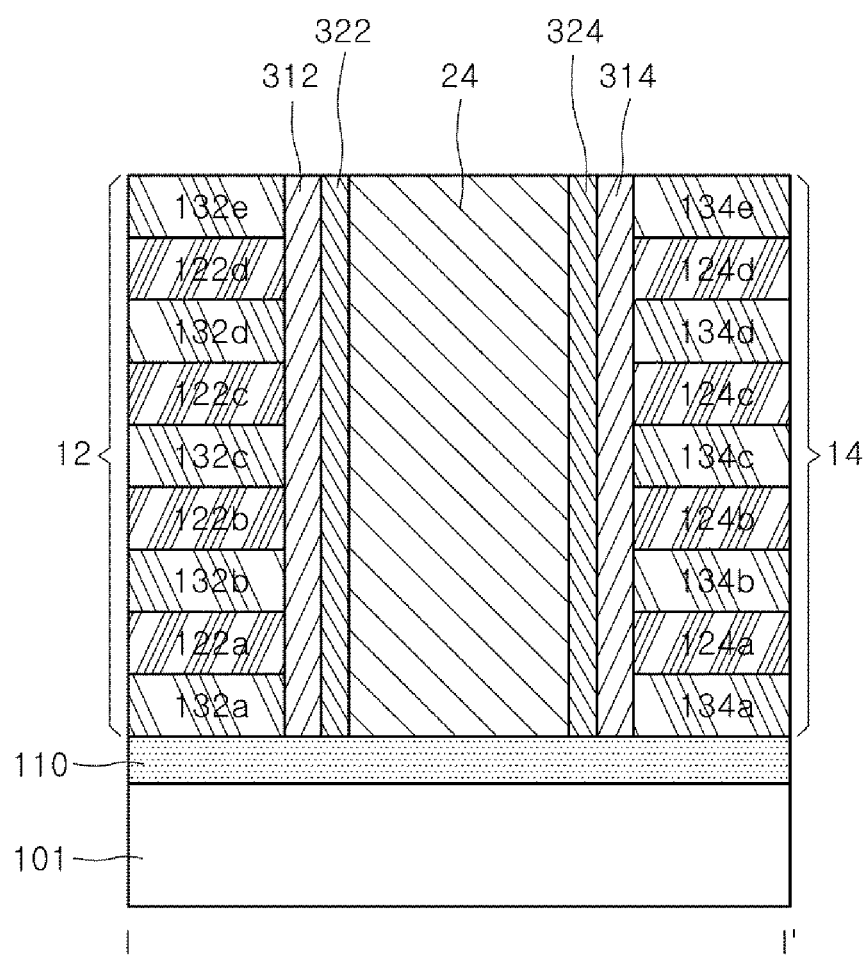
FIG. 3 is a cross-sectional view taken along a line I-I' of the nonvolatile memory device of FIG. 1.

FIG. 1 is a perspective view illustrating a nonvolatile memory device according to an embodiment of the present disclosure. FIG. 2 is a plan view of the nonvolatile memory device of FIG. 1. FIG. 3 is a cross-sectional view taken along a line I-I' of the nonvolatile memory device of FIG. 1.

Referring to FIGS. 1 to 3, the nonvolatile memory device 1 may include a substrate 101 and first and second channel structures 12 and 14 disposed over the substrate 101. The nonvolatile memory device 1 may also include first and second resistance change layers 312 and 314, first and second gate insulation layers 322 and 324, and first to fourth gate line structures 22, 24, 26 and 28. The first resistance change layer 312 and the first gate insulation layer 322 may be sequentially disposed, in the x-direction, on a sidewall surface of the first channel structure 12, and the second resistance change layer 314 and the second gate insulation layer 324 may sequentially disposed, in the x-direction, on a sidewall surface of the second channel structure 14. The first to fourth gate line structures 22, 24, 26 and 28 may be disposed, over the substrate 101, between the first channel structure 12 and the second channel structure 14, and each gate line structure may be disposed to contact the first and second gate insulation layers 322 and 324.

In addition, the nonvolatile memory device 1 may further include a base insulation layer 110 disposed on the substrate 101. The nonvolatile memory device 1 may further include first to fifth insulation structures 41, 43, 45, 47 and 49 extending in a first direction (i.e., z-direction) perpendicular to the substrate 101, over the substrate 101.

The nonvolatile memory device 1 may include a first memory element 1a and a second memory element 1b. The first memory element 1a may include the first channel structure 12, the first resistance change layer 312, the first gate insulation layer 322, the first to fourth gate line structures 22, 24, 26 and 28, and the first to fifth insulation structures 41, 43, 45, 47 and 49. The second memory element 1b may include the second channel structure 14, the second resistance change layer 314, the second gate insulation layer 324, the first to fourth gate line structures 22, 24, 26 and 28, and the first to fifth insulation structures 41, 43, 45, 47 and 49. The first and second memory elements 1a and 1b may share the first to fourth gate line structures 22, 24, 26 and 28, and the first to fifth insulation structures 41, 43, 45, 47 and 49. The first and second memory elements 1a and 1b may each have a plurality of randomly accessible memory cells, as described below. That is, the first memory element 1a and the second memory element 1b may store different signals in the plurality of memory cells.

The substrate 101 may include a semiconductor material. Specifically, the semiconductor material may include silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

The base insulation layer 110 may be disposed on the substrate 101. The base insulation layer 110 may electrically insulate the first and second channel structures 12 and 14, the first and second resistance change layers 312 and 314, the first and second gate insulation layers 322 and 324, the first to fourth gate line structures 22, 24, 26 and 28 from the substrate 101, respectively.

Although not illustrated in FIG. 1, at least one conductive layer and at least one insulation layer may be disposed between the substrate 101 and the base insulation layer 110.

The conductive layer and the insulation layer may form various circuit patterns. That is, the conductive layer and the insulation layer may form a plurality of wirings or may constitute passive elements such as capacitors or resistors, or active elements such as diodes or transistors, by way of non-limiting examples.

Referring again to FIG. 1, the first channel structure 12 may be disposed on the base insulation layer 110. The first channel structure 12 may include first to fourth channel layer patterns 122a, 122b, 122c and 122d and first to fifth interlayer insulation layer patterns 132a, 132b, 132c, 132d and 132e, which are alternately stacked along the first direction (i.e., the z-direction) perpendicular to an upper surface of the substrate 101, on the base insulation layer 110. The first interlayer insulation layer pattern 132a may be disposed to contact the base insulation layer 110. The fifth interlayer insulation layer pattern 132e may be disposed as an uppermost layer of the first channel structure 12.

The first channel structure 12 may extend in a second direction (i.e., y-direction) perpendicular to the first direction (i.e., the z-direction). The first to fourth channel layer patterns 122a, 122b, 122c and 122d may be electrically insulated from each other by the first to fifth interlayer insulation layer patterns 132a, 132b, 132c, 132d and 132e. The first to fourth channel layer patterns 122a, 122b, 122c and 122d each may be connected to a pair of different electrodes, such as a source electrode and a drain electrode (not illustrated), respectively. The pair of source and drain electrodes may be disposed at both ends of each of the first to fourth channel layer patterns 122a, 122b, 122c and 122d extending in the second direction (i.e., y-direction). The pair of different source and drain electrodes may apply a source-drain voltage to a corresponding channel layer pattern from among the first to fourth channel layer patterns 122a, 122b, 122c and 122d.

In an embodiment, the first to fourth channel layer patterns 122a, 122b, 122c and 122d may include a semiconductor material or metal oxide. The semiconductor material may, for example, include doped silicon (Si), doped germanium (Ge), doped gallium arsenide (GaAs), and the like. The semiconductor material may, for another example, include a two-dimensional semiconductor material. The two-dimensional semiconductor material may include transition metal dichalcogenide (TMDC), black phosphorus, and the like. The transition metal dichalcogenide may, for example, include molybdenum selenide (MoSe2), hafnium selenide (HfSe2), indium selenide (InSe), gallium selenide (GaSe), and the like. As an example, the metal oxide may include indium-gallium-zinc oxide (IGZO).

The first to fifth interlayer insulation layer patterns 132a, 132b, 132c, 132d and 132e may each include an insulative material. The insulative material may, for example, include oxide, nitride, oxynitride, and the like. In an embodiment, the first to fifth interlayer insulation layer patterns 132a, 132b, 132c, 132d and 132e may each be a silicon oxide layer, a silicon nitride layer, or a silicon oxynitride layer.

In some other embodiments, the number of the channel layer patterns of the first channel structure 12 may not necessarily be limited to four. The channel layer patterns may be disposed in various numbers, and the number of interlayer insulation layer patterns may also vary accordingly to insulate the various numbers of channel layer patterns along the first direction (i.e., z-direction).

Referring to FIGS. 1 and 3, the first resistance change layer 312 may be disposed on the base insulation layer 110, and on one sidewall surface S1 of the first channel structure 12. Here, the one sidewall surface S1 may be a plane defined by the first and second directions (i.e., a y-z plane formed by a z-direction and y-direction). The first resistance change layer 312 may have a predetermined thickness t1 along a third direction (i.e., the x-direction) perpendicular to the first and second directions. The first resistance change layer 312 may have a thickness of 10 nanometers (nm) to 100 nanometers (nm), inclusive.

The first resistance change layer 312 may include a variable resistance material. In the variable resistance material, an internal resistance state may be variably changed according to a polarity or a magnitude of a voltage applied from outside. In addition, the variable resistance material may maintain or retain the changed internal resistance state after the externally applied voltage is removed. As an example, the internal resistance state may be one of a high resistance state and a low resistance state, which are distinguished from each other. That is, the variable resistance material may have a predetermined first resistance value corresponding to the high resistance state and may have a predetermined second resistance value corresponding to the low resistance state. The first resistance value and the second resistance value of a resistance change layer may be determined according to the kind of the variable resistance material.

In an embodiment, the variable resistance material may include oxygen vacancies or movable metal ions. The oxygen vacancies may have a positive charge. The metal ion may be a cation having a positive charge, or an anion having a negative charge.

In an embodiment, the variable resistance material may, for example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In other embodiments, the variable resistance material may include, for example, PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr)$MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, $YB_{a2}Cu_3O_7$, or a combination of two or more thereof. As another example, the variable resistance material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $GexSe_{1-x}$ ($0<x<1$), silver sulfide ($Ag_2S$), copper sulfide ($Cu_2S$), Cadmium sulfide (CdS), zinc sulfide (ZnS), and selenium oxide ($CeO_2$), or a combination of two or more thereof.

Meanwhile, the first gate insulation layer 322 may be disposed, on the base insulation layer 110, to cover the first resistance change layer 312. In an embodiment, the first gate insulation layer 322 may be disposed to contact one surface S2 of the first resistance change layer 312. The one surface S2 may be a plane defined by the first and second directions (i.e., a y-z plane formed by the z-direction and y-direction). The first gate insulation layer 322 may have a predetermined thickness t2 along the third direction (i.e., the x-direction). As an example, the first gate insulation layer 322 may have a thickness of 1 nanometer (nm) to 50 nanometers (nm), inclusive.

The first gate insulation layer 322 may include a dielectric material. The dielectric material may, for example, include silicon oxide, silicon nitride, silicon oxynitride, aluminum oxide, hafnium oxide, and the like. The dielectric material may, for example, have a paraelectric property.

The first to fourth gate line structures 22, 24, 26 and 28 may be disposed, on the base insulation layer 110, to extend along the first direction (i.e., the z-direction). The first to fourth gate line structures 22, 24, 26 and 28 may each have a pillar or pillar-like shape. Each of the first to fourth gate line structures 22, 24, 26 and 28 may be disposed to contact one surface S3 of the first gate insulation layer 322. The one surface S3 may be a plane defined by the first and second directions (i.e., a y-z plane formed by the z-direction and y-direction).

Each of the first to fourth gate line structures 22, 24, 26 and 28 may be disposed to overlap portions of the first to fourth channel layer patterns 122a, 122b, 122c and 122d of the first channel structure 12. Further, the first to fourth gate line structures 22, 24, 26 and 28 may be disposed to be spaced apart from each other in the second direction (i.e., the y-direction).

The first to fourth gate line structures 22, 24, 26 and 28 may each include a conductive material. The conductive material may, for example, include a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Meanwhile, when a gate voltage of a predetermined threshold voltage or higher is applied to the first to fourth gate line structures 22, 24, 26 and 28, as described below with reference to FIG. 4B, a conductive channel may be formed in each of the first to fourth channel layer patterns 122a, 122b, 122c, 122d. The conductive channel may be formed to extend in the second direction (i.e., the y-direction).

In FIGS. 1 to 3, although not illustrated, a corresponding source electrode and a corresponding drain electrode may be disposed at opposite ends of each of the first to fourth channel layer patterns 122a, 122b, 122c and 122d, and may be disposed to extend in the second direction (i.e., the y-direction). For example, a first source electrode and a first drain electrode may be disposed at opposite ends of the first channel layer pattern 122a. Likewise, a second source electrode and a second drain electrode may be disposed at opposite ends of the second channel layer pattern 122b. A third source electrode and a third drain electrode may be disposed at opposite ends of the third channel layer pattern 122c. A fourth source electrode and a fourth drain electrode may be disposed at opposite ends of the fourth channel layer pattern 122d. The first to fourth source electrodes may be different electrodes that are distinguished from each other, and the first to fourth drain electrodes may also be different electrodes that are distinguished from each other.

An electric potential may be applied independently or separately to the first to fourth source electrodes and the first to fourth drain electrodes, respectively. For example, after the conductive channel is formed, a predetermined source-drain voltage may be applied between the first source electrode and the first drain electrode, so that a source-drain current can flow along the conductive channel of the first channel layer pattern 122a. Likewise, after the conductive channels are formed, the source-drain voltage may be applied between the corresponding second to fourth source electrodes and the second to fourth drain electrodes, so that source-drain current can flow along the conductive channel formed in each of the second to fourth channel layer patterns 122b, 122c and 122d.

Referring to FIGS. 1 and 2, the first to fifth insulation structures 41, 43, 45, 47 and 49 may be disposed, between the neighboring or adjacent gate line structures, among the first to fourth gate lines structures 22, 24, 26 and 28. The first to fifth insulation structures 41, 43, 45, 47 and 49 may each have a pillar or pillar-like shape extending in the first direction (i.e., the z-direction). The first to fifth insulation structures 41, 43, 45, 47 and 49 may electrically insulate the neighboring or adjacent gate line structures from each other. For example, first to fifth insulation structures 41, 43, 45, 47 and 49 may be disposed to alternate with the first to fourth gate lines structures 22, 24, 26 and 28 in the second direction (i.e., the y-direction). In addition, the first to fifth insulation structures 41, 43, 45, 47 and 49 may each contact the first and second gate insulation layers 322 and 324 in the third direction (i.e., the x-direction).

The first to fifth insulation structures 41, 43, 45, 47 and 49 may each include an insulative material. The insulative material may, for example, include oxide, nitride, oxynitride, or a combination of two or more thereof. In an embodiment, the first to fifth insulation structures 41, 43, 45, 47 and 49 may each include silicon oxide, silicon nitride, silicon oxynitride, or a combination of two or more thereof. The first to fifth insulation structures 41, 43, 45, 47 and 49 may each include the same insulative material. Alternately, the first to fifth insulation structures 41, 43, 45, 47 and 49 may each include different kinds of insulative materials.

Referring to FIGS. 1 to 3, the second gate insulation layer 324 may be disposed, on the base insulation layer 110, to contact sidewall surfaces of the first to fourth gate lines structures 22, 24, 26 and 28 and the first to fifth insulation structures 41, 43, 45, 47 and 49. The sidewall surfaces of the first to fourth gate lines structures 22, 24, 26 and 28 and the first to fifth insulation structures 41, 43, 45, 47 and 49 common to the second gate insulation layer 324 may be positioned on the same plane S4. The plane S4 may be a plane defined by the first and second directions (i.e., a y-z plane formed by the z-direction and y-direction). That is, the second gate insulation layer 324 may be disposed on the plane S4.

The second gate insulation layer 324 may have a predetermined thickness t2 along the third direction (i.e., the x-direction). The configuration of the second gate insulation layer 324 may be substantially the same as the configuration of the first gate insulation layer 322.

The second resistance change layer 314 may be disposed on one surface S5 of the second gate insulation layer 324. The one surface S5 may be a plane defined by the first and second directions (i.e., a y-z plane formed by the z-direction and y-direction). The second resistance change layer 314 may have a predetermined thickness t1 along the third direction (i.e., the x-direction). The configuration of the second resistance change layer 314 may be substantially the same as the configuration of the first resistance change layer 312.

The second channel structure 14 may be disposed on the base insulation layer 110 to contact one surface S6 of the second resistance change layer 314. The one surface S6 may be a plane defined by the first and second directions (i.e., a y-z plane formed by the z-direction and y-direction). The second channel structure 14 may include the first to fourth channel layer patterns 124a, 124b, 124c and 124d and the first to fifth interlayer insulation layer patterns 134a, 134b, 134c, 134d and 134e, which are alternately stacked on the base insulation layer 110 along the first direction (i.e., the z-direction). The first interlayer insulation layer pattern 134a may be disposed to contact the base insulation layer 110. The fifth interlayer insulation layer pattern 134e may be disposed as the uppermost layer. The second channel structure 14 may extend in the second direction (i.e., the y-direction). The configurations of the first to fourth channel layer patterns 124a, 124b, 124c and 124d and the first to fifth interlayer insulation layer patterns 134a, 134b, 134c, 134d and 134e of the second channel structure 14 may be substantially the same as the configurations of the first to fourth channel layer patterns 122a, 122b, 122c and 122d and the first to fifth interlayer insulation layer patterns 132a, 132b, 132c, 132d and 132e of the first channel structure 12, respectively.

Meanwhile, when a gate voltage of a predetermined threshold voltage or higher is applied to the first to fourth gate line structures 22, 24, 26 and 28, conductive channels may be formed in the first to fourth channel layer patterns 124a, 124b, 124c and 124d of the second channel structure 14, as well as in the first to fourth channel layer patterns 122a, 122b, 122c and 122d of the first channel structure 12. The conductive channels formed in the first to fourth channel layer patterns 124a, 124b, 124c and 124d of the second channel structure 14 may extend in the second direction (i.e., the y-direction).

In FIGS. 1 to 3, although not illustrated, a source electrode and a drain electrode may be disposed at both ends of each of the first to fourth channel layer patterns 124a, 124b, 124c and 124d of the second channel structure 14 extending in the second direction (i.e., the y-direction). As an example, a fifth source electrode and a fifth drain electrode may be disposed at opposite ends of the first channel layer pattern 124a. Likewise, a sixth source electrode and a sixth drain electrode may be disposed at opposite ends of the second channel layer pattern 124b. A seventh source electrode and a seventh drain electrode may be disposed at opposite ends of the third channel layer pattern 124c. An eighth source electrode and an eighth drain electrode may be disposed at opposite ends of the fourth channel layer pattern 124d.

An electric potential may be applied, independently or separately, to each of the fifth to eighth source electrodes and the fifth to eighth drain electrodes. For example, after the conductive channels are formed, a predetermined source-drain voltage may be applied between the fifth source electrode and the fifth drain electrode, so that a source-drain current can flow through the conductive channel of the first channel layer pattern 124a. Likewise, after the conductive channels are formed, the source-drain voltage may be applied between the sixth to eighth source electrodes and the sixth to eighth drain electrode, so that source-drain current can flow along the respective conductive channels formed in the second to fourth channel layer patterns 124b, 124c and 124d.

Referring again to FIGS. 1 to 3, the nonvolatile memory device 1 may include four gate line structures 22, 24, 26 and 28 that are arranged along the second direction (i.e., the y-direction), but the number of the gate line structures is not necessarily limited to four. In other embodiments, the nonvolatile memory device 1 may include various other numbers of gate line structures arranged along the second direction (i.e., the y-direction). Also, the nonvolatile memory device 1 may include an additional one or more memory elements disposed along the third direction (i.e., the x-direction). That is, the nonvolatile memory device 1 may further include a resistance change layer, a gate insulation layer and a gate line structure which are continuously and sequentially disposed on the sidewall surfaces of the first channel structure 12 or the second channel structure 14 along the third direction (i.e., the x-direction). Additional resistance change layers and gate insulation layers may be utilized common to existing first channel structure 12 or the second channel structure 14 as required.

Figure 4A:
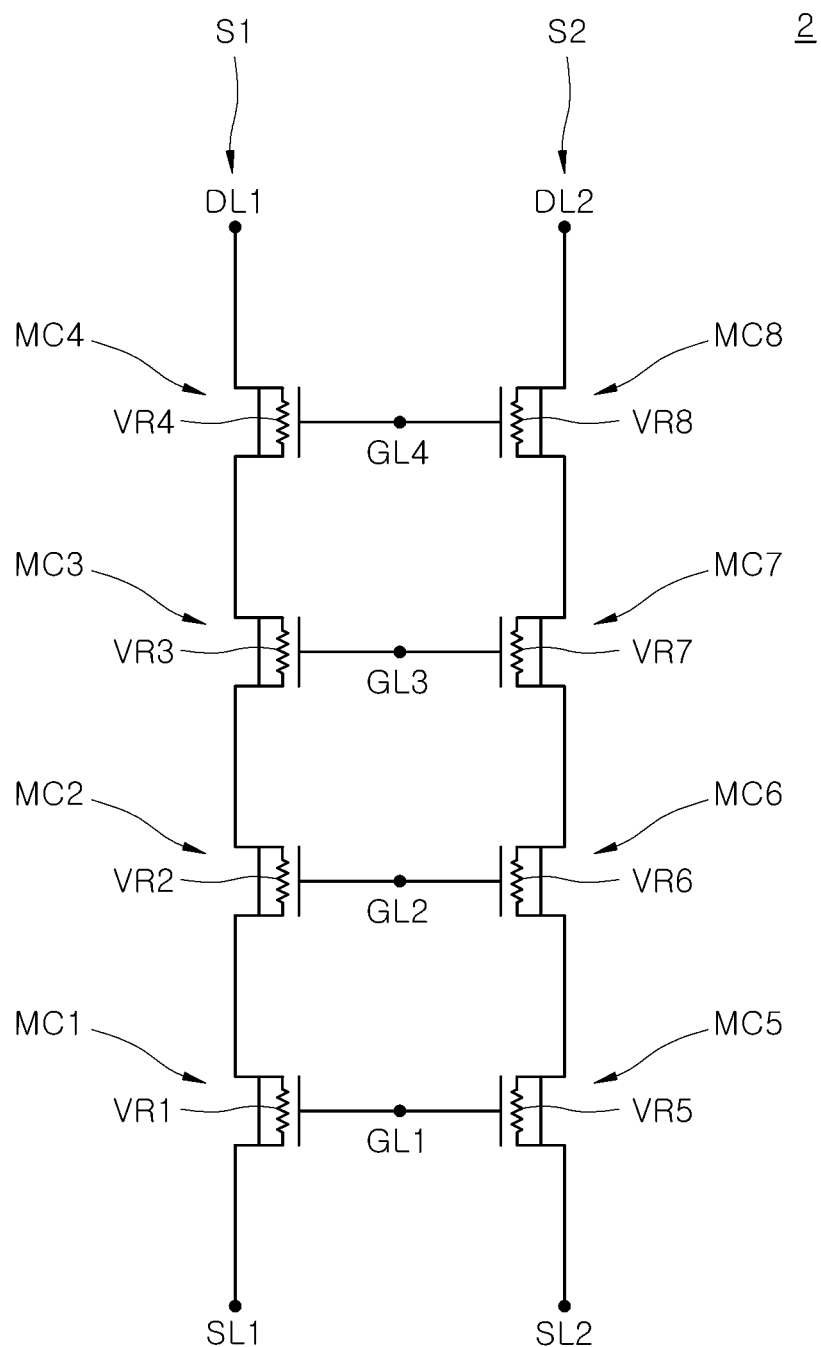
FIG. 4A is a circuit diagram of a nonvolatile memory device according to an embodiment of the present disclosure.

FIG. 4A is a circuit diagram of a nonvolatile memory device according to an embodiment of the present disclosure. FIGS. 4B to 4D are views illustrating an operation method of the nonvolatile memory device corresponding to the circuit diagram of FIG. 4A. In order to explain the operation method, the structure of the nonvolatile memory device 1 described above with reference to FIGS. 1 to 3 may be used.

Referring to FIG. 4A, the nonvolatile memory device 2, which may have the same or substantially the same structure as nonvolatile memory device 1, may have transistor-type first to eighth memory cells MC1, MC2, MC3, MC4, MC5, MC6, MC7 and MC8. The first to fourth memory cells MC1, MC2, MC3 and MC4 may constitute a first string S1. In the first string S1, a source line and a drain line of the transistors may be connected in series to each other. The ends of the first string S1 may be respectively connected to the first source electrode SL1 and the first drain electrode DL1. Similarly, the fifth to eighth memory cells MC5, MC6, MC7 and MC8 may constitute a second string S2. In the second string S2, a source line and a drain line of the transistors may be connected in series to each other. The ends of the second string S2 may be respectively connected to the second source electrode SL2 and the second drain electrode DL2.

Gate electrodes of the first to eighth memory cells MC1, MC2, MC3, MC4, MC5, MC6, MC7 and MC8 may be connected to the corresponding first to fourth global gate lines GL1, GL2, GL3 and GL4. For example, the first global gate line GL1 may be connected to the gate electrodes of the first and fifth memory cells MC1 and MC5. The second global gate line GL2 may be connected to the gate electrodes of the second and sixth memory cells MC2 and MC6. The third global gate line GL3 may be connected to the gate electrodes of the third and seventh memory cells MC3 and MC7. The fourth global gate line GL4 may be connected to the gate electrodes of the fourth and eighth memory cells MC4 and MC8.

The first to eighth memory cells MC1, MC2, MC3, MC4, MC5, MC6, MC7 and MC8 may include corresponding first to eighth resistance change layers VR1, VR2, VR3, VR4, VR5, VR6, VR7 and VR8, which are disposed between the channel layer and the gate insulation layer of each corresponding transistor. The first to eighth memory cells MC1, MC2, MC3, MC4, MC5, MC6, MC7 and MC8 may store electrical resistance states in the corresponding first to eighth resistance change layers VR1, VR2, VR3, VR4, VR5, VR6, VR7 and VR8 as signal information in a non-volatile manner. As described below, the resistance states in the first to eighth resistance change layers VR1, VR2, VR3, VR4, VR5, VR6, VR7 and VR8 may vary according to electric fields formed in conductive channels. The resistance states in the first to eighth resistance change layers VR1, VR2, VR3, VR4, VR5, VR6, VR7 and VR8 may be stored or retained in a non-volatile manner after the electric fields are removed. Accordingly, the first to eighth resistance change layers VR1, VR2, VR3, VR4, VR5, VR6, VR7 and VR8 may act as memory layers of the first to eighth memory cells MC1, MC2, MC3, MC4, MC5, MC6, MC7 and MC8.

Figure 4B:
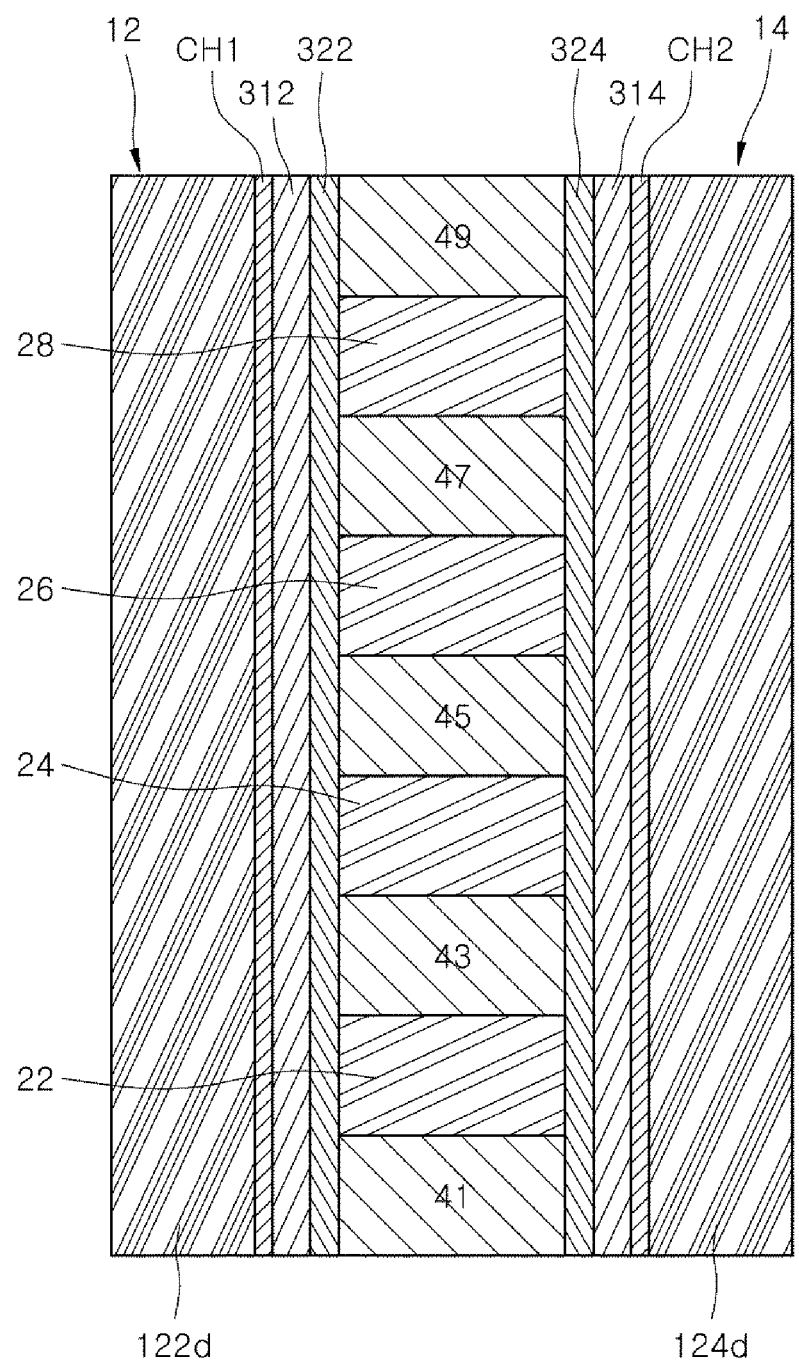
FIGS. 4B to 4D are views illustrating an operation method of a nonvolatile memory device corresponding to the circuit diagram of FIG. 4A.
Figure 4C:
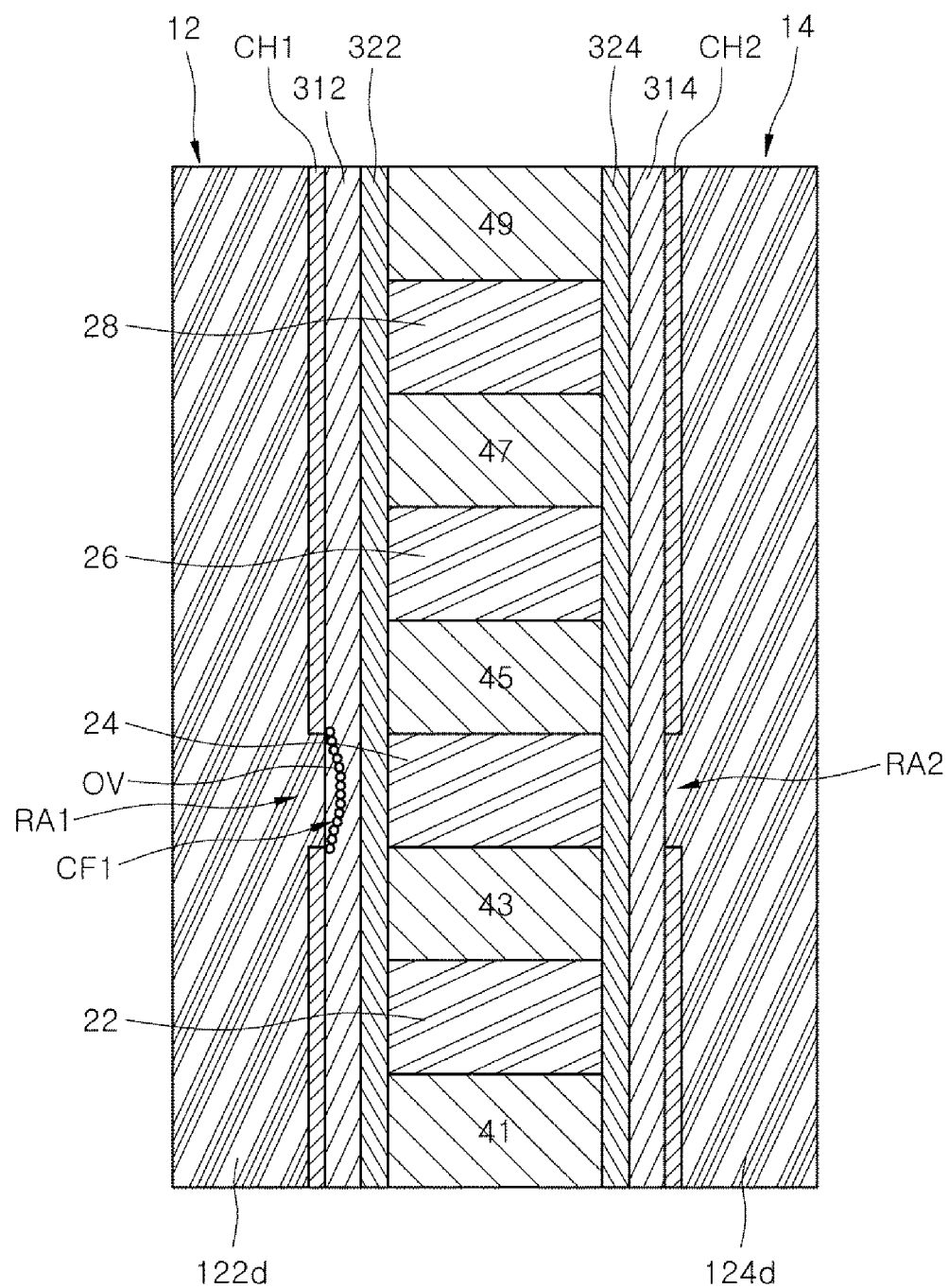
Figure 4D:
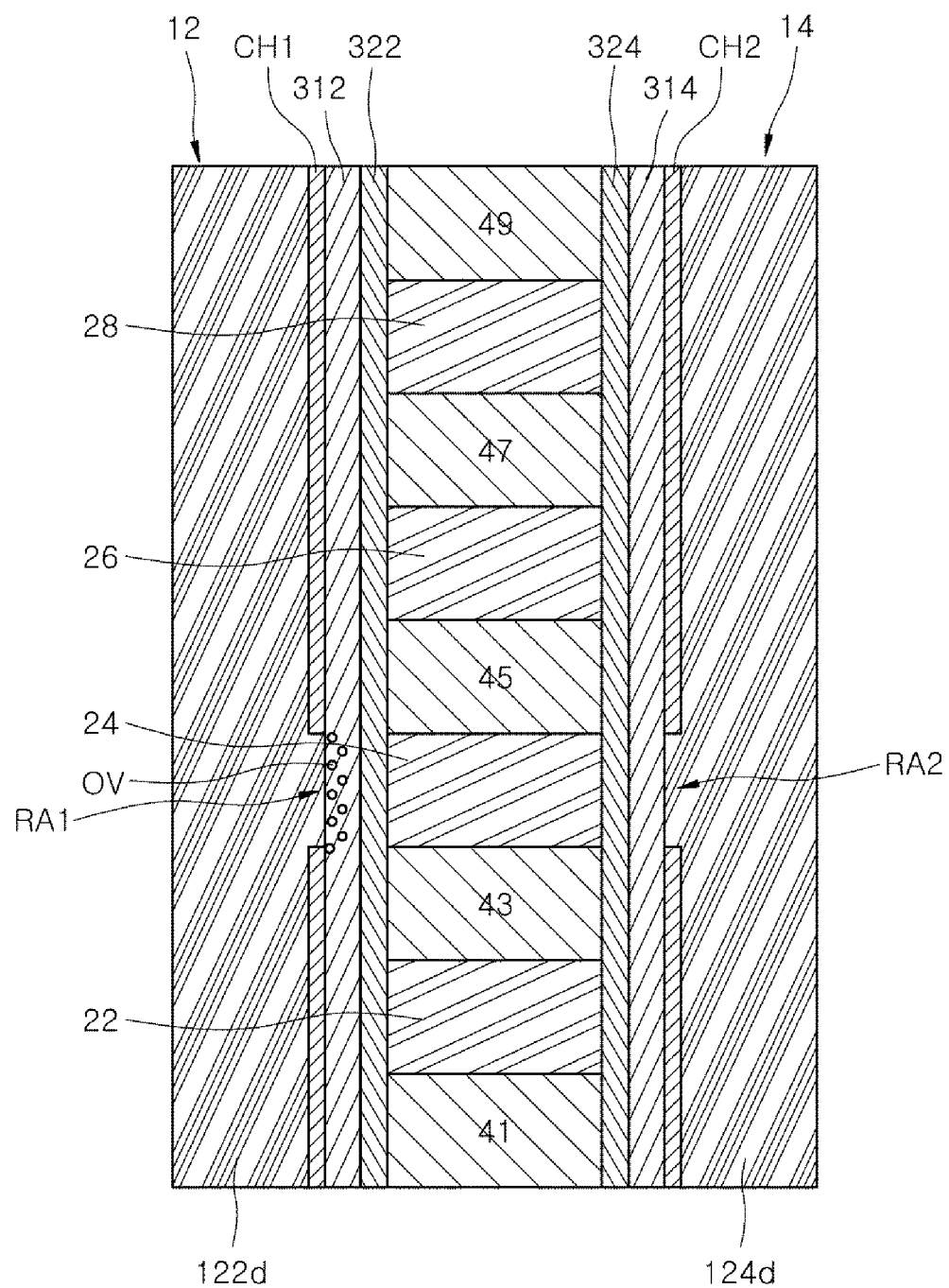

Referring to FIGS. 4B to 4D, the first to fourth global gate lines GL1, GL2, GL3 and GL4 illustrated in FIG. 4A may correspond to the first to fourth gate line structures 22, 24, 26 and 28, respectively, in FIGS. 1 to 3.

In an embodiment, as described above with reference to FIGS. 1 to 4A, the first channel structure 12 may have first to fourth channel layer patterns 122*a*, 122*b*, 122*c* and 122*d*, and the second channel structure 14 may have first to fourth channel layer patterns 124*a*, 124*b*, 124*c* and 124*d*. The first channel layer pattern 122*a* of the first channel structure 12 and the first channel layer pattern 124*a* of the second channel structure 14, together with the first and second resistance change layers 312 and 314, the first and second gate insulation layers 322 and 324, and the first to fourth gate line structures 22, 24, 26 and 28, may constitute the first to eighth memory cells MC1, MC2, MC3, MC4, MC5, MC6, MC7 and MC8 of FIG. 4A. In addition, the second channel layer pattern 122*b* of the first channel structure 12 and the second channel layer pattern 124*b* of the second channel structure 14, together with the first and second resistance change layer 312 and 314, the first and second gate insulation layers 322 and 324, and the first to fourth gate line structures 22, 24, 26 and 28, may constitute another first to eighth memory cells. Similarly, the third channel layer pattern 122*c* of the first channel structure 12 and the third channel layer pattern 124*c* of the second channel structure 14 may be included in another first to eighth memory cells, and the fourth channel layer pattern 122*d* of the first channel structure 12 and the fourth channel layer pattern 124*d* of the second channel structure 14 may be included in another first to eighth memory cells.

For convenience of description, FIGS. 4B to 4D illustrate the first to eighth memory cells MC1, MC2, MC3, MC4, MC5, MC6, MC7 and MC8 of FIG. 4A, which are composed of the fourth channel layer pattern 122*d* of the first channel structure 12, the fourth channel layer pattern 124*d* of the second channel structure 14, the first and second resistance change layer 312 and 314, the first and second gate insulation layers 322 and 324, and the first to fourth gate line structures 22, 24, 26 and 28. However, the same operation methods may be applied to another first to eighth memory cells that use other channel layers. In addition, in FIGS. 4B to 4D, for convenience of description, the interlayer insulation layer patterns 132*e* and 134*e*, as the uppermost layers, are omitted. As an example, in FIGS. 4B to 4D, an operation method in which internal resistance changes through filament formation in the first and second resistance change layers 312 and 314 will be described. In such instances, the first and second resistance change layers 312 and 314 may include metal oxide having oxygen vacancies or movable metal ions OV.

Referring to FIGS. 4B to 4D, first, a target memory cell to which a write operation is to be performed may be selected from among a plurality of memory cells of a nonvolatile memory device. In an embodiment, as a memory cell to which a set operation described in connection with FIG. 4C and a reset operation described in connection with FIG. 4D are performed, a portion of a nonvolatile memory device including the fourth channel layer pattern 122*d* of the first channel structure 12, the first resistance change layer 312, the first gate insulation layer 322, and the second gate line structure 22 may be used for illustrative purposes. The device portion may correspond to the second memory cell MC2 of FIG. 4A.

Referring to FIG. 4B, a gate voltage of a predetermined threshold voltage or greater may be applied to the first to fourth gate line structures 22, 24, 26 and 28. By applying the gate voltage, conductive channels CH1 and CH2 may be formed in the fourth channel layer pattern 122*d* of the first channel structure 12 and in the fourth channel layer pattern 124*d* of the second channel structure 14, respectively, in areas or regions covered by the first to fourth gate line structures 22, 24, 26 and 28 as viewed along the x-direction.

In an embodiment, the electric fields formed by applying the gate voltage to adjacent gate line structures may extend in a lateral direction (i.e., the y-direction) to act as a driving force for channel formation in portions of the fourth channel layer pattern 122*d* of the first channel structure 12 and in portions of the fourth channel layer pattern 124*d* of the second channel structure 14, respectively, that do not overlap the first to fourth gate line structures 22, 24, 26 and 28 in the third direction (i.e., the x-direction). This channel formation process is in addition to conductive channels formed in portions of the fourth channel layer pattern 122*d* of the first channel structure 12 and in portions of the fourth channel layer pattern 124*d* of the second channel structure 14 that respectively overlap the first to fourth gate line structures 22, 24, 26 and 28 in the third direction (i.e., the x-direction). As a result, continuous channels CH1 and CH2 may be respectively formed in the fourth channel layer pattern 122*d* of the first channel structure 12 and the fourth channel layer pattern 124*d* of the second channel structure 14.

Referring to FIG. 4C, a set operation for a memory cell of the nonvolatile memory device will be described. The set operation refers to an operation of converting the resistance state of the resistance change layer in the memory cell to a low resistance state, as between a high resistance state and a low resistance state, and then storing the resultant low resistance state as signal information.

As an example, as indicated above, a set operation performed in a portion of the first resistance change layer 312 corresponding to the second memory cell MC2 of FIG. 4A will be described. For the set operation, the gate voltage applied to the second gate line structure 24 corresponding to the second memory cell MC2 may be removed. The gate voltage may be maintained in the first, third, and fourth gate line structures 22, 26, and 28.

As a result, portions RA1 and RA2 of the conductive channels CH1 and CH2 formed in the fourth channel layer pattern 122*d* of the first channel structure 12 and the fourth channel layer pattern 124*d* of the second channel structure 14, which are substantially overlapped in the x-direction by the second gate line structure 24, may be electrically disconnected from remaining portions of the conductive channels CH1 and CH2 as the gate voltage is removed.

Subsequently, while continuously applying the gate voltage to the first, third and fourth gate line structures 22, 26 and 28, a set voltage may be applied to source line and drain line ends of the fourth channel layer pattern 122*d* of the first channel structure 12. The set voltage may be concentrated on the ends, in the y-direction, of the portion RA1 in which the conductive channel CH1 is disconnected in the fourth channel layer pattern 122*d*.

A set electric field formed by the set voltage may be applied in the first resistance change layer 312 adjacent to the portion RA1 where the conductive channel CH1 is disconnected. By developing the set electric field, oxygen vacancies or movable metal ions OV inside the first resistance change layer 312 may be aggregated or combined to form a conductive filament CF1. The conductive filament CF1 may connect the y-direction ends of the disconnected portions of the conductive channel CH1.

After the set voltage is removed, the conductive filament CF1 may remain in the portion of the first resistance change layer 312 corresponding to the second memory cell MC2.

Accordingly, signal information indicating a low resistance state may be stored, in a nonvolatile manner, in the portion of the first resistance change layer 312.

Meanwhile, because the set voltage is not applied between the second source electrode SL2 and the second drain electrode DL2 connected to the fourth channel layer pattern 124*d* of the second channel structure 14, the conductive filament is not formed inside the second resistance change layer 314 adjacent to the disconnected portions of the second channel CH2 in the third direction (i.e., the x-direction). Therefore, the set operation does not occur in a portion of the second resistance change layer 314 corresponding to the sixth memory cell MC6 of FIG. 4A.

Next, with reference to FIG. 4D, a reset operation for the memory cells of the nonvolatile memory device will be described. First, a memory cell to perform the reset operation may be determined or selected. The reset operation refers to an operation of converting the resistance state of the resistance change layer in the memory cell from a low resistance state to a high resistance state, and then storing the resultant high resistance state as signal information.

As an example, a reset operation performed on portions of the first resistance change layer 312 corresponding to the second memory cell MC2 of FIG. 4C will be described below. First, as in the method described above with reference to FIG. 4B, a gate voltage of a predetermined threshold voltage or higher may be applied to the first to fourth gate line structures 22, 24, 26 and 28. Conductive channels CH1 and CH2 may be formed in the fourth channel layer pattern 122*d* of the first channel structure 12 and the fourth channel layer pattern 124*d* of the second channel structure 14 by applying the gate voltage to the first to fourth gate line structures 22, 24, 26 and 28.

Subsequently, the gate voltage applied to the second gate line structure 24 may be removed. The gate voltage may be maintained in the first, third and fourth gate line structures 22, 26 and 28. In accordance therewith, the portions RA1 and RA2 of the conductive channels CH1 and CH2 formed respectively in the fourth channel layer pattern 122*d* of the first channel structure 12 and the fourth channel layer pattern 124*d* of the second channel structure 14, which are substantially overlapped in the x-direction by the second gate line structure may be electrically disconnected from remaining portions of the conductive channels CH1 and CH2.

Subsequently, while continuously applying the gate voltage to the first, third and fourth gate line structures 22, 26 and 28, a reset voltage may be applied to the source line and drain line ends of the fourth channel layer pattern 122*d* of the first channel structure 12. The reset voltage may have a different polarity from the set voltage described above with reference to FIG. 4C.

Meanwhile, the reset voltage may be concentrated on the ends, in the y-direction, of the portion RA1 in which the conductive channel is disconnected. A reset electric field formed by the reset voltage may be applied to the first resistance change layer 312 adjacent to the portion RA1 where the conductive channel is disconnected. The reset electric field may provide a driving force for disconnecting the conductive filament CF1. In an embodiment, the reset electric field may generate Joule heat in the conductive filament CF1 formed inside the first resistance change layer 312, and the Joule heat may decompose the oxygen vacancies or movable metal ions OV inside the conductive filament CF1. Accordingly, the conductive filament CF1 degrades and at least a portion of the conductive filament CF1 may be broken or detached.

Even after the reset voltage is removed, the conductive filament CF1 may remain in a state in which at least a portion of the first resistance change layer 312 corresponding to the second memory cell MC2 is disconnected. As the conductive filament CF1 is disconnected, signal information indicating a high resistance state may be stored in a nonvolatile manner in the portion of the first resistance change layer 312.

Meanwhile, because the reset voltage is not applied between the second source electrode SL2 and the second drain electrode DL2 connected to the fourth channel layer pattern 124*d* of the second channel structure 14, decomposition of the conductive filament does not occur inside the second resistance change layer 314 adjacent to the disconnected portion of the second channel CH2 in the third direction (i.e., x-direction). Therefore, the reset operation does not occur in the portion of the second resistance change layer 314 corresponding to the sixth memory cell MC6 in FIG. 4A.

Meanwhile, a read operation for the memory cells of the nonvolatile memory device will be described with reference to FIGS. 4C and 4D. First, a memory cell to which a read operation is performed may be determined. As an example, a read operation in the first resistance change layer 312 corresponding to the second memory cell MC2 of FIG. 4A will be described. First, as in the method described above with reference to FIG. 4B, a gate voltage of a predetermined threshold voltage or higher may be applied to the first to fourth gate line structures 22, 24, 26 and 28. Conductive channels CH1 and CH2 may be formed respectively in the fourth channel layer pattern 122*d* of the first channel structure 12 and the fourth channel layer pattern 124*d* of the second channel structure 14, by applying the gate voltage to the first to fourth gate line structures 22, 24, 26 and 28.

Subsequently, the gate voltage applied to the second gate line structure 24 may be removed. Accordingly, the portions RA1 and RA2 of the conductive channels CH1 and CH2 respectively formed in the fourth channel layer pattern 122*d* of the first channel structure 12 and the fourth channel layer pattern 124*d* of the second channel structure 14, which are substantially overlapped by the second gate line structure 24 in the x-direction, may be electrically disconnected.

While applying the gate voltage to the first, third and fourth gate line structures 22, 26 and 28, a read voltage may be applied to source line and drain line ends of the fourth channel layer pattern 122*d* of the first channel structure 12. An absolute value of the read voltage may be smaller than an absolute value of the set voltage and the reset voltage described above with reference to FIGS. 4C and 4D. Accordingly, a change in the resistance state does not occur inside the portion of the first resistance change layer 312 adjacent to the disconnected portion of the conductive channel CH1 by the application of the read voltage.

As in FIG. 4C, when a conductive filament CF1 is formed in a portion of the first resistance change layer 312 adjacent to the disconnected portion RA1 of the conductive channel CH1, the conductive channel CH1 may have a relatively high electrical conductivity along the second direction (i.e., the y-direction), which corresponds to a low resistance state in memory cell MC2. Meanwhile, as in FIG. 4D, when an unbroken conductive filament CF1 is not present in the portion of the first resistance change layer 312 adjacent to the disconnected portion RA1 of the conductive channel CH1, the conductive channel CH1 may have a relatively low electrical conductivity along the second direction (i.e., the y-direction), which corresponds to a high resistance state in memory cell MC2. As a result, the resistance state stored in a predetermined memory cell can be read by evaluating the electrical conductivity of the entire conductive channel CH1 along the second direction (i.e., the y-direction) while the portion of the conductive channel CH1 corresponding to the predetermined memory cell is disconnected.

Figure 5:
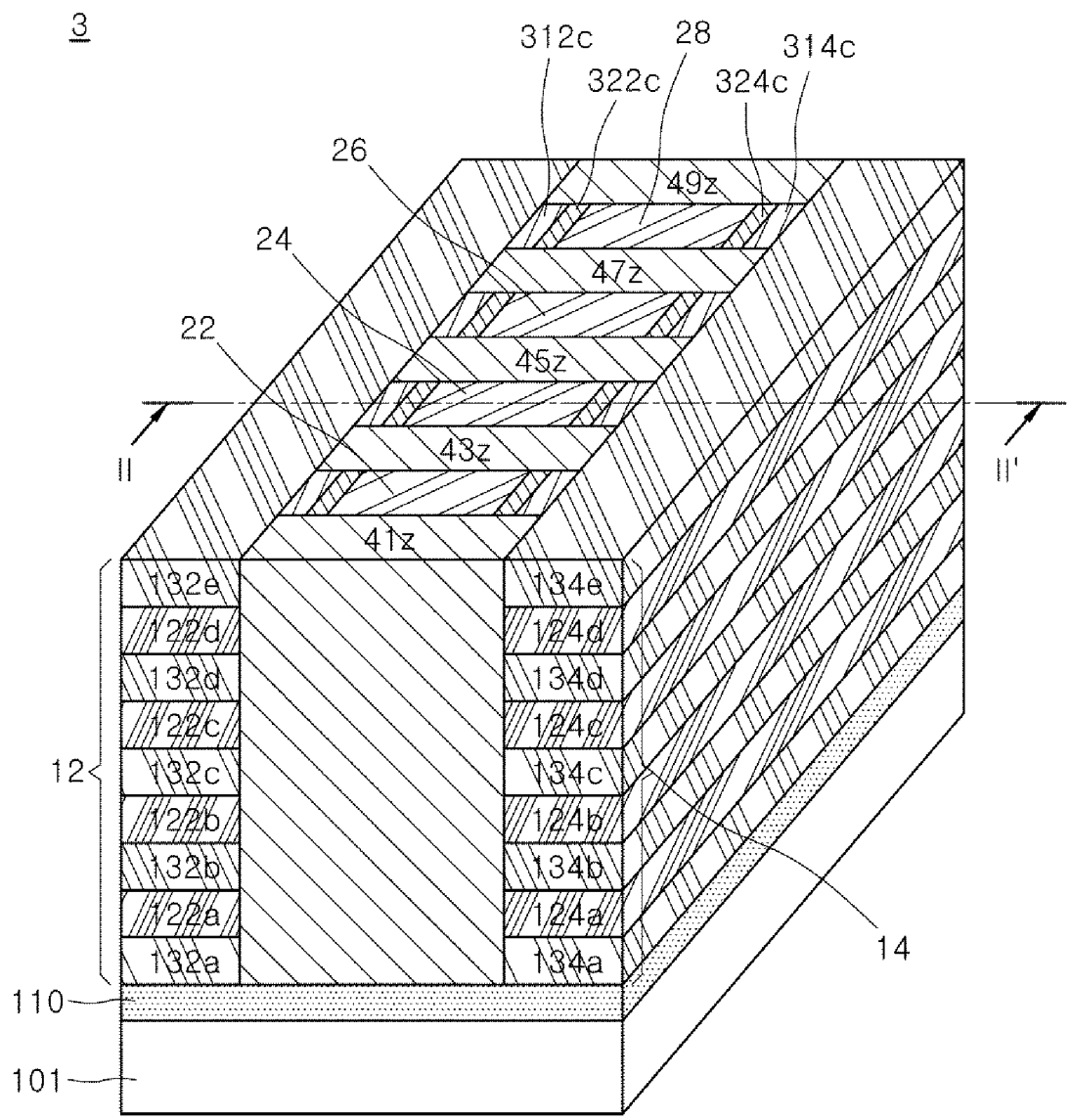
FIG. 5 is a perspective view illustrating a nonvolatile memory device according to another embodiment of the present disclosure.
Figure 6:
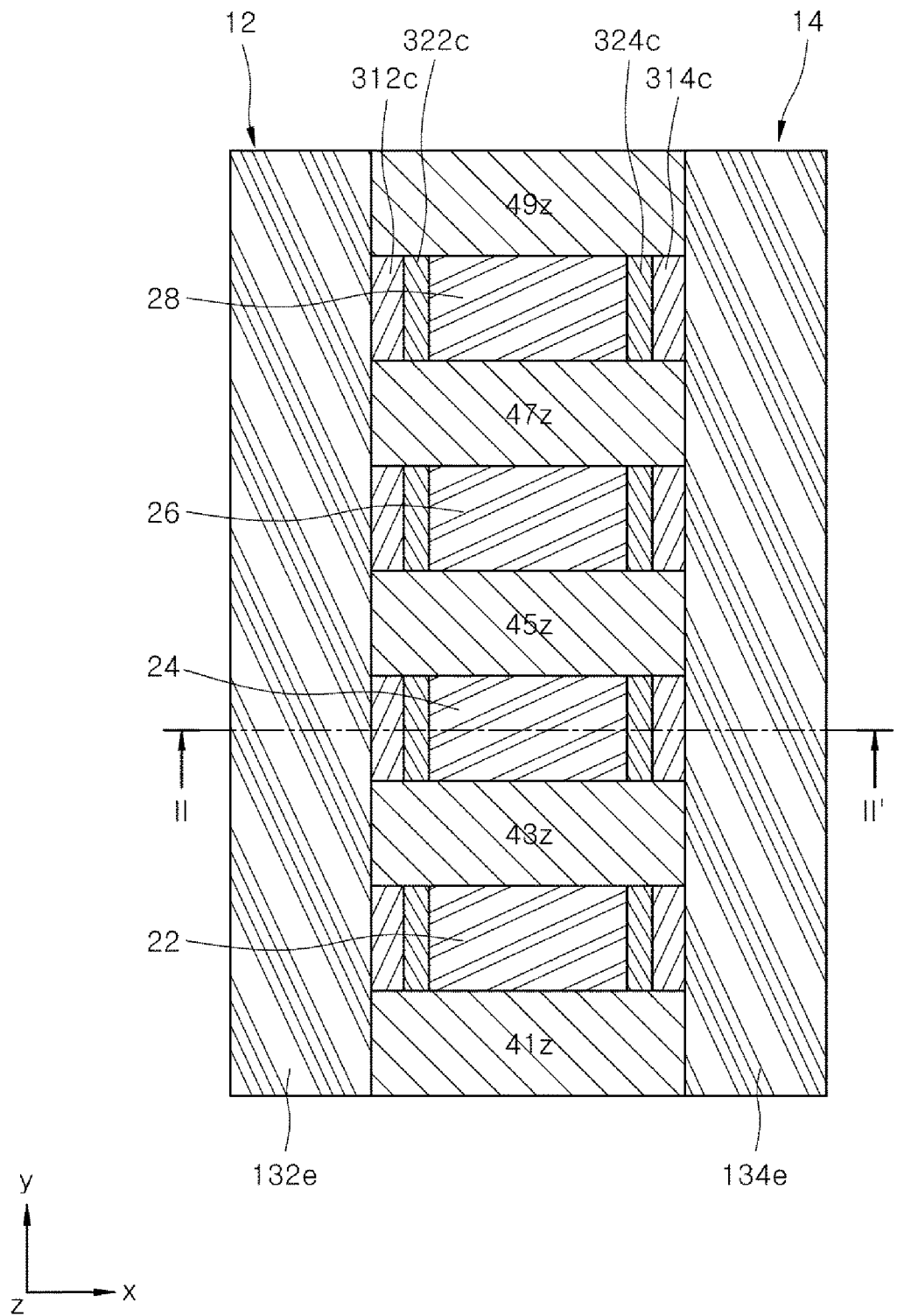
FIG. 6 is a plan view of the nonvolatile memory device of FIG. 5.
Figure 7:
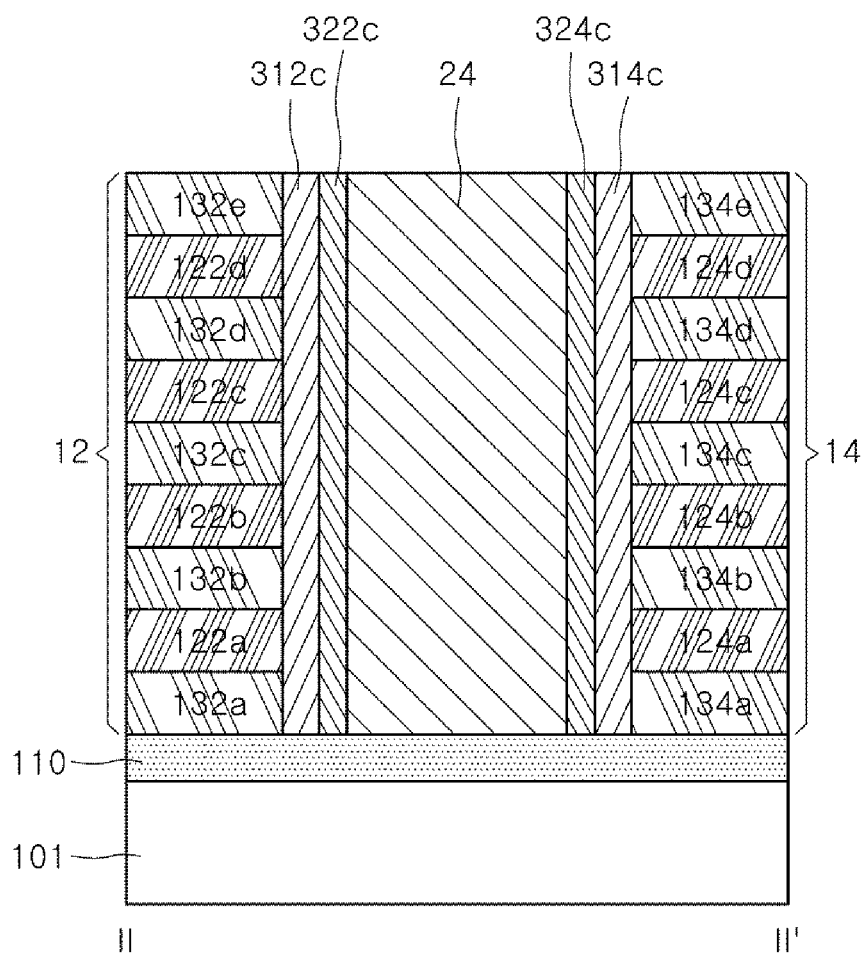
FIG. 7 is a cross-sectional view taken along a line II-II' of the nonvolatile memory device of FIG. 5.

FIG. 5 is a perspective view illustrating a nonvolatile memory device according to another embodiment of the present disclosure. FIG. 6 is a plan view of the nonvolatile memory device of FIG. 5. FIG. 7 is a cross-sectional view taken along a line II-II' of the nonvolatile memory device of FIG. 5.

Referring to FIGS. 5 to 7, a nonvolatile memory device 3 may have substantially the same configuration as compared to the nonvolatile memory device 1 described above with reference to FIGS. 1 to 3, except for first to fifth insulation structures 41z, 43z, 45z, 47z and 49z.

The first to fifth insulation structures 41z, 43z, 45z, 47z and 49z of the embodiment may extend further in the third direction (i.e., the x-direction) than the first to fifth insulation structures 41, 43, 45, 47 and 49 illustrated in FIGS. 1 to 3. The first to fifth insulation structures 41z, 43z, 45z, 47z and 49z may extend to directly contact first and second channel structures 12 and 14 in the third direction (i.e., the x-direction). Accordingly, first and second gate insulation layers 322c and 324c and first and second resistance change layers 312c and 314c may each be disposed in a form of a pattern along a second direction (i.e., the y-direction). In other words, the first and second gate insulation layers 322c and 324c may be segmented and separated from each other by the first to fifth insulation structures 41z, 43z, 45z, 47z and 49z and discontinuously disposed along the second direction (i.e., the y-direction). Similarly, the first and second resistance change layers 312c and 314c may be separated from each other by the first to fifth insulation structures 41z, 43z, 45z, 47z and 49z and discontinuously disposed along the second direction (i.e., the y-direction).

According to an embodiment, regions of the first and second resistance change layers 312c and 314c and first and second gate insulation layers 322c and 324c substantially overlapped in the x-direction by the first to fourth gate line structures 22, 24, 26 and 28 may be separated from each other along the second direction (i.e., the y-direction). That is, in the nonvolatile memory device 3, the regions of the resistance change layers 312c and 314c in which signal information is stored can be distinguished from each other along the second direction (i.e., the y-direction) for each memory cell. Accordingly, it is possible to exclude the occurrence of electrical interference in a portion of the resistance change layer controlled by a gate line structure when adjacent gate line structures have different applied gate voltages. As a result, the reliability of signal information stored for each memory cell in the nonvolatile memory device can be improved by the above-described configuration of first to fifth insulation structures 41z, 43z, 45z, 47z and 49z.

Figure 8:
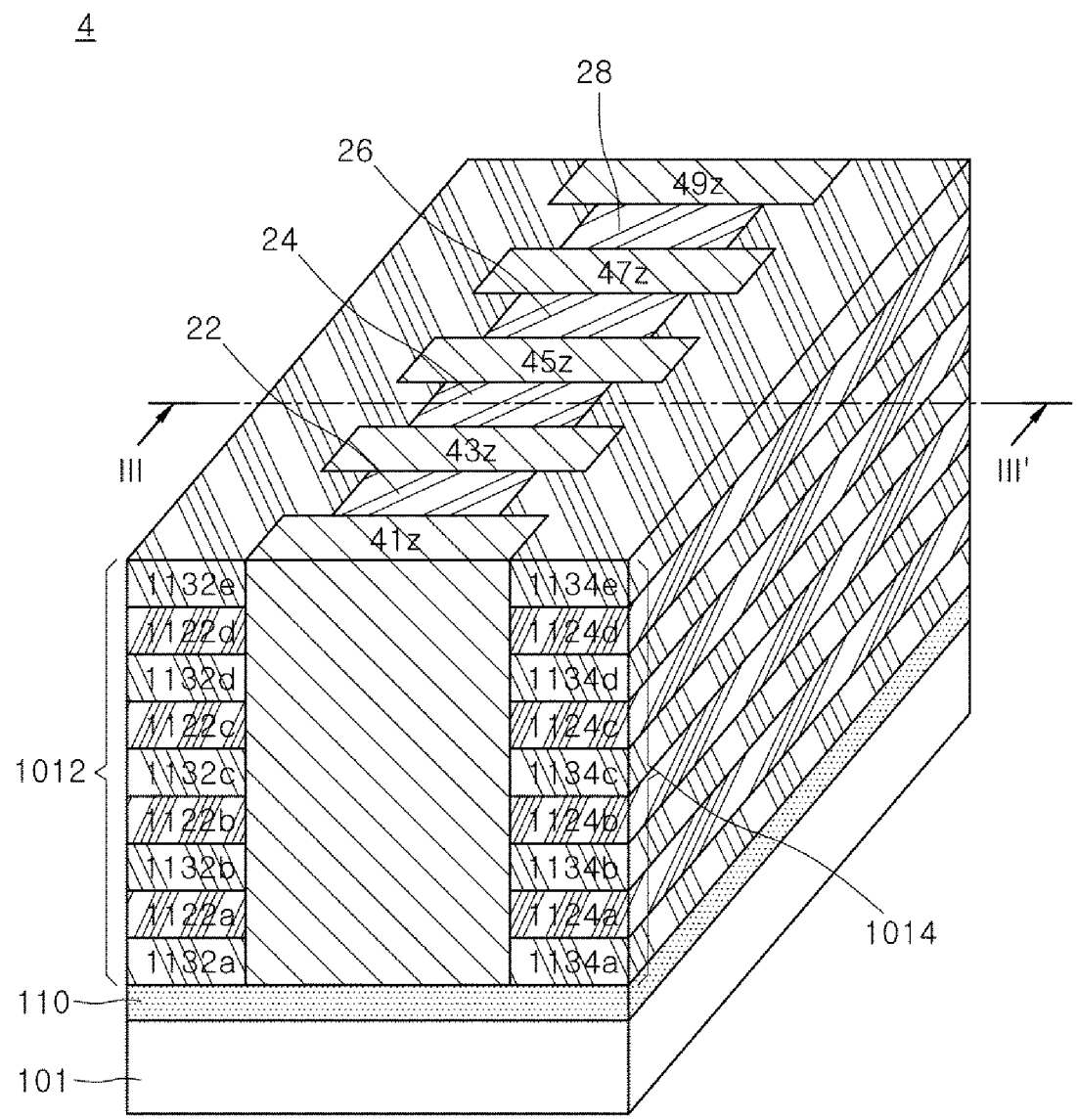
FIG. 8 is a perspective view illustrating a nonvolatile memory device according to yet another embodiment of the present disclosure.
Figure 9:
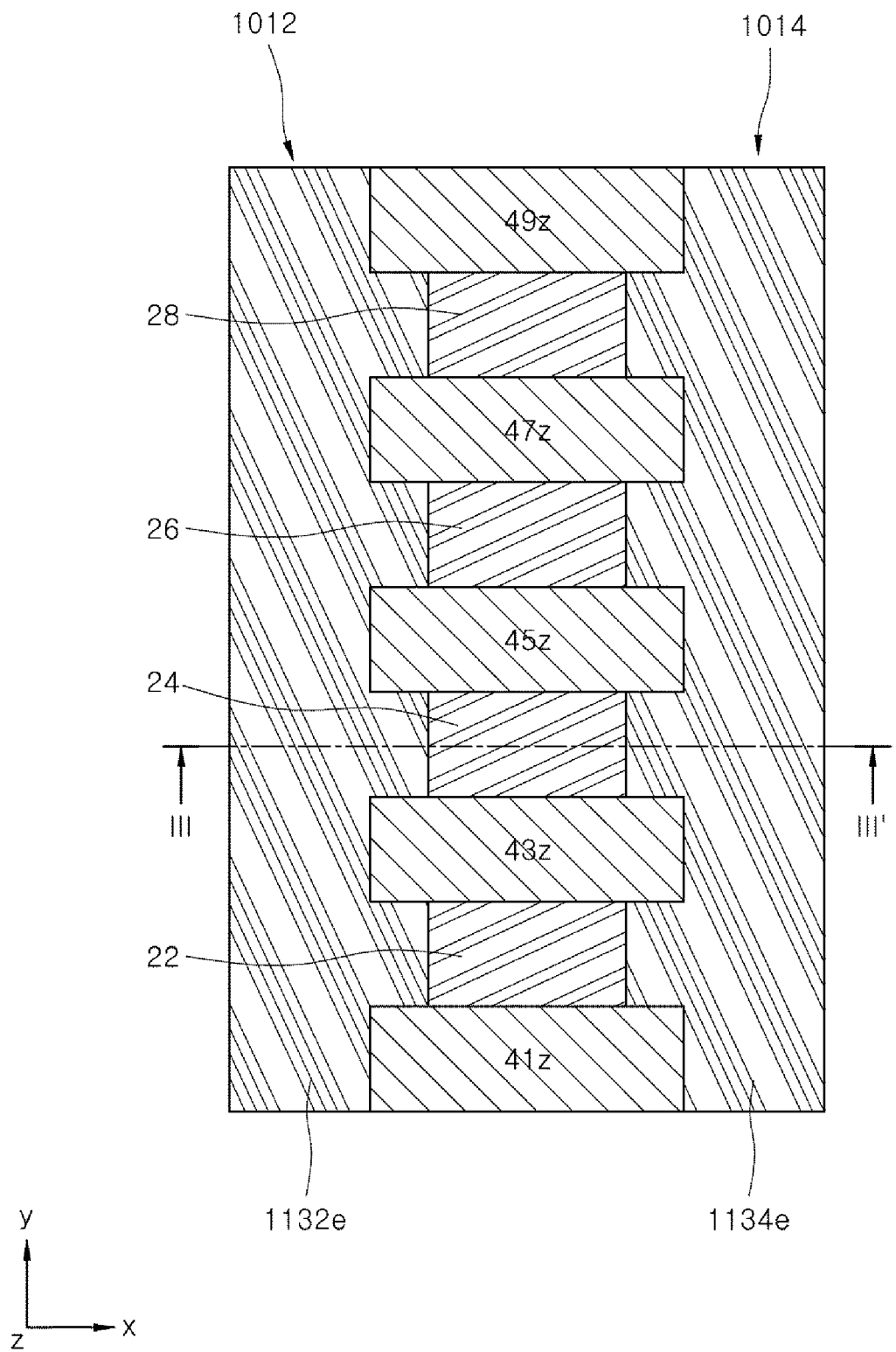
FIG. 9 is a plan view of the nonvolatile memory device of FIG. 8.
Figure 10:
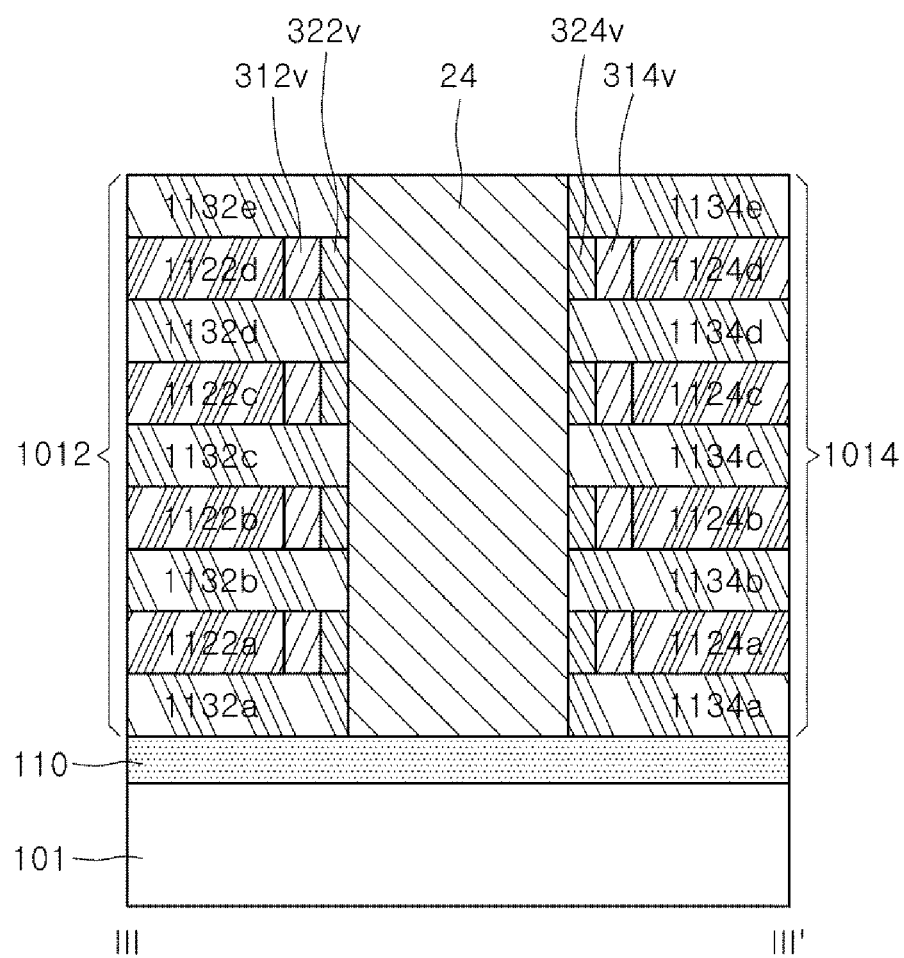
FIG. 10 is a cross-sectional view taken along a line III-III' of the nonvolatile memory device of FIG. 8.

FIG. 8 is a perspective view illustrating a nonvolatile memory device according to yet another embodiment of the present disclosure. FIG. 9 is a plan view of the nonvolatile memory device of FIG. 8. FIG. 10 is a cross-sectional view taken along a line III-III' of the nonvolatile memory device of FIG. 8.

Referring to FIGS. 8 to 10, a nonvolatile memory device 4 may have substantially the same configuration, except for first and second channel structures 1012 and 1014, when compared to the nonvolatile memory device 3 described above with reference to FIGS. 5 to 7.

The first channel structure 1012 of the embodiment may have first to fourth channel layer patterns 1122a, 1122b, 1122c and 1122d and first to fifth interlayer insulation layer patterns 1132a, 1132b, 1132c, 1132d and 1132e, which are alternately stacked on a base insulation layer 110. Here, the first to fifth interlayer insulation layer patterns 1132a, 1132b, 1132c, 1132d and 1132e may extend further in a third direction (i.e., the x-direction) than the first to fifth interlayer insulation layer patterns 132a, 132b, 132c, 132d and 132e described above with reference to FIGS. 5 to 7. More specifically, the first to fifth interlayer insulation layer patterns 1132a, 1132b, 1132c, 1132d and 1132e may be disposed to directly contact first to fourth gate line structures 22, 24, 26 and 28 in the third direction (i.e., the x-direction). Accordingly, as illustrated in FIG. 10, a first resistance change layer 312v and a first gate insulation layer 322v may be separated from each other by the first to fifth interlayer insulation layer patterns 1132a, 1132b, 1132c, 1132d and 1132e to be discontinuously disposed along the first direction (i.e., the z-direction).

Similarly, the second channel structure 1014 of the embodiment may have first to fourth channel layer patterns 1124a, 1124b, 1124c and 1124d and first to fifth interlayer insulation layer patterns 1134a, 1134b, 1134c, 1134d and 1134e, which are alternately stacked on the base insulation layer 110. Here, the first to fifth interlayer insulation layer patterns 1134a, 1134b, 1134c, 1134d and 1134e may extend further in the third direction (i.e., the x-direction) than the first to fifth interlayer insulation layer patterns 134a, 134b, 134c, 134d and 134e described above with reference to FIGS. 5 to 7. More specifically, the first to fifth interlayer insulation layer patterns 1134a, 1134b, 1134c, 1134d and 1134e may be disposed to directly contact the first to fourth gate line structures 22, 24, 26 and 28 in the third direction (i.e., the x-direction). Accordingly, as illustrated in FIG. 10, a second resistance change layer 314v and a second gate insulation layer 324v may be separated from each other by the first to fifth interlayer insulation layer patterns 1134a, 1134b, 1134c, 1134d and 1134e and 1132e to be discontinuously disposed along the first direction (i.e., the z-direction).

In an embodiment, as compared to an embodiment described with reference to FIGS. 5 to 7, the regions of the first and second resistance change layers 312v and 314v and the first and second gate insulation layers 322v and 324v substantially overlapped in the x-direction by the first to fourth gate line structures 22, 24, 26 and 28 may further be separated along the first direction (i.e., the z-direction). That is, the regions of the resistance change layers 312v and 314v in which signal information is stored in the nonvolatile memory device 4 can be distinguished from each other for each memory cell along the first direction (i.e., the z-direction). Accordingly, within the same gate line structure, the gate voltage applied to a portion of the resistance change layer of a first memory cell generates an electric field that does not interfere with the portion of the resistance change layer of a different memory cell located above or below the first memory cell along the first direction (i.e., the z-direction). As a result, the above-described first to fifth interlayer insulation layer patterns 1132a, 1132b, 1132c, 1132d, 1132e, 1134a, 1134b, 1134c, 1134d and 1134e of the first and second channel structures 1012 and 1014 have a configuration that improves the reliability of signal information stored for each memory cell in the nonvolatile memory device.

Figure 11:
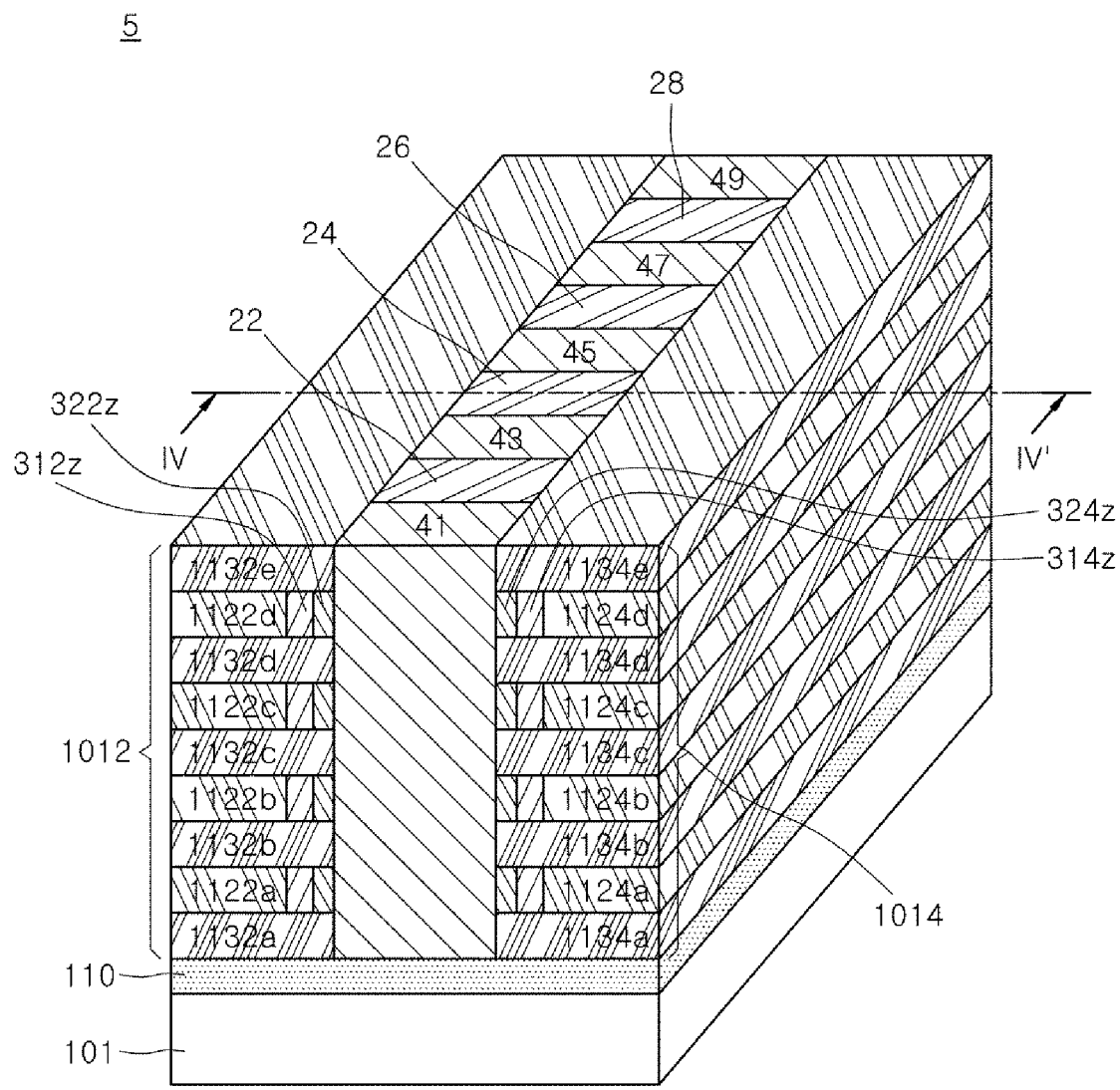
FIG. 11 is a perspective view illustrating a nonvolatile memory device according to a further embodiment of the present disclosure.
Figure 12:
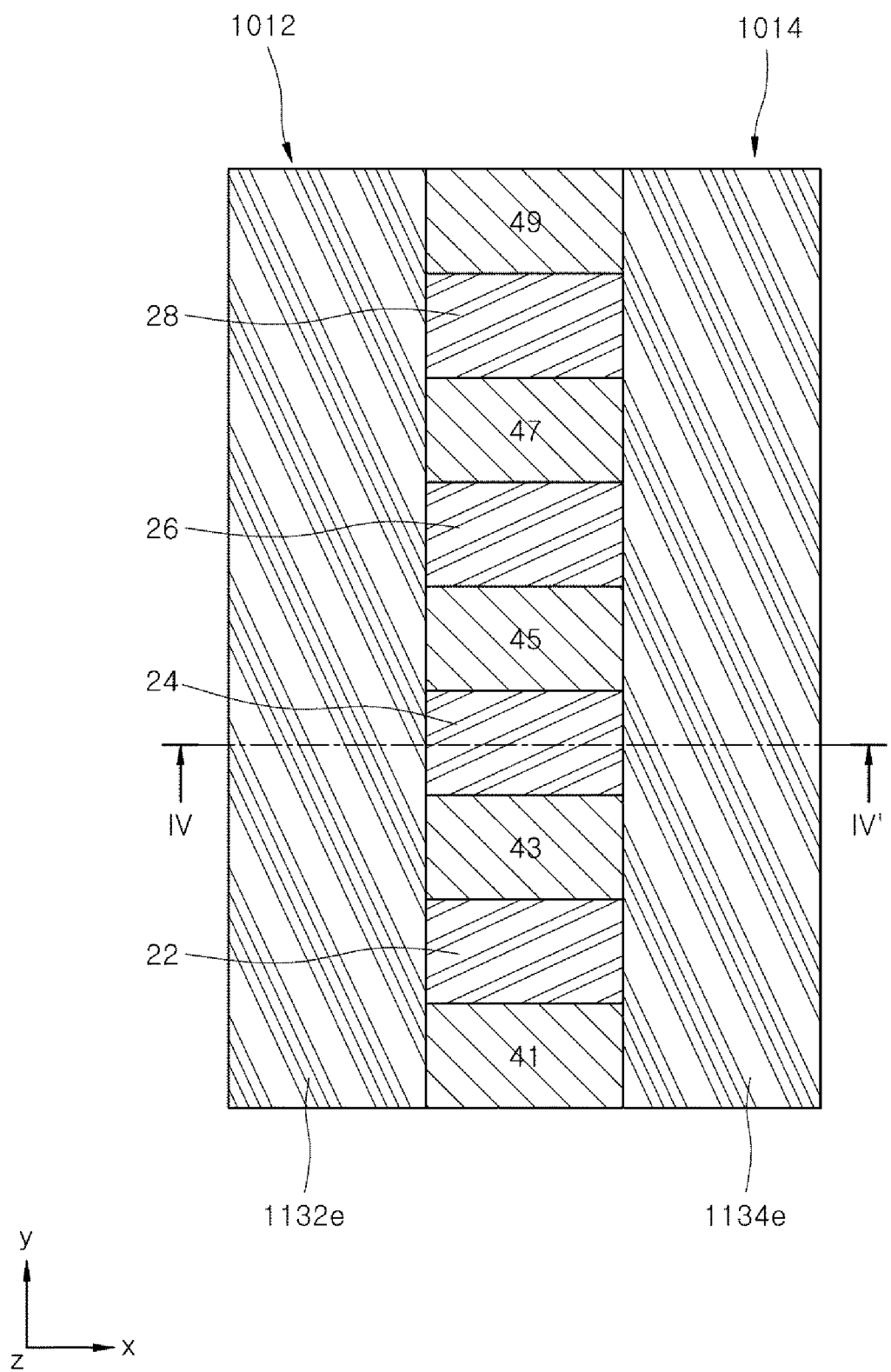
FIG. 12 is a plan view of the nonvolatile memory device of FIG. 10.
Figure 13:
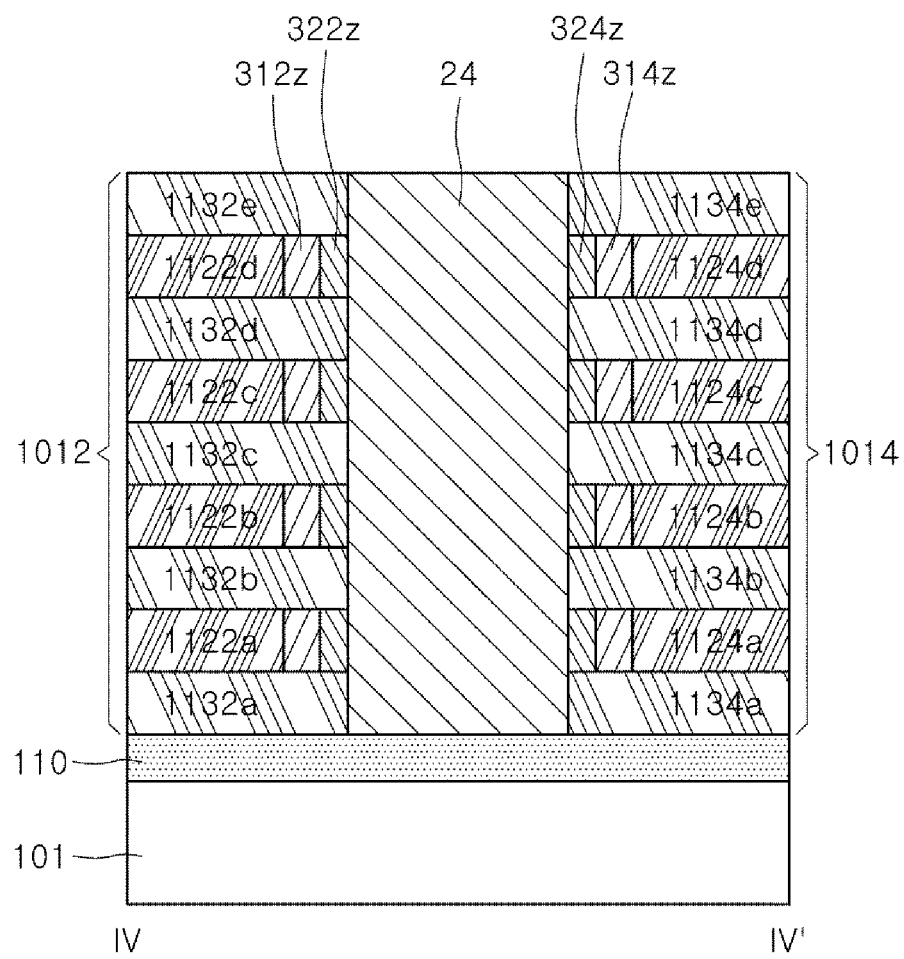
FIG. 13 is a cross-sectional view taken along a line IV-IV' of the nonvolatile memory device of FIG. 11.

FIG. 11 is a perspective view illustrating a nonvolatile memory device according to a further embodiment of the present disclosure. FIG. 12 is a plan view of the nonvolatile memory device of FIG. 10. FIG. 13 is a cross-sectional view taken along a line IV-IV' of the nonvolatile memory device of FIG. 8.

Referring to FIGS. 11 to 13, a nonvolatile memory device 5 may have substantially the same configuration, except for first and second channel structures 1012 and 1014, when compared to the nonvolatile memory device 1 described above with reference to FIGS. 1 to 3.

The first channel structure 1012 of the embodiment may have first to fourth channel layer patterns 1122a, 1122b, 1122c and 1122d and first to fifth interlayer insulation layer patterns 1132a, 1132b, 1132c, 1132d and 1132e, which are alternately stacked on a base insulation layer 110. Here, the first to fifth interlayer insulation layer patterns 1132a, 1132b, 1132c, 1132d and 1132e may extend further in a third direction (i.e., the x-direction) than the first to fifth interlayer insulation layer patterns 132a, 132b, 132c, 132d and 132e described above with reference to FIGS. 1 to 3. More specifically, the first to fifth interlayer insulation layer patterns 1132a, 1132b, 1132c, 1132d and 1132e may be disposed to directly contact first to fourth gate line structures 22, 24, 26 and 28 in the third direction (i.e., the x-direction). Accordingly, as illustrated in FIGS. 11 to 13, a first resistance change layer 312z and a first gate insulation layer 322z may be separated from each other by the first to fifth interlayer insulation layer patterns 1132a, 1132b, 1132c, 1132d and 1132e to be discontinuously disposed along the first direction (i.e., the z-direction).

Similarly, the second channel structure 1014 of the embodiment may have first to fourth channel layer patterns 1124a, 1124b, 1124c and 1124d and first to fifth interlayer insulation layer patterns 1134a, 1134b, 1134c, 1134d and 1134e, which are alternately stacked on the base insulation layer 110. Here, the first to fifth interlayer insulation layer patterns 1134a, 1134b, 1134c, 1134d and 1134e may extend further in the third direction (i.e., the x-direction) than the first to fifth interlayer insulation layer patterns 134a, 134b, 134c, 134d and 134e described above with reference to FIGS. 1 to 3. More specifically, the first to fifth interlayer insulation layer patterns 1134a, 1134b, 1134c, 1134d and 1134e may be disposed to directly contact first to fourth gate line structures 22, 24, 26 and 28 in the third direction (i.e., the x-direction). Accordingly, as illustrated in FIG. 13, a second resistance change layer 314z and a second gate insulation layer 324z may be separated from each other by the first to fifth interlayer insulation layer patterns 1134a, 1134b, 1134c, 1134d and 1134e and 1132e to be discontinuously disposed along the first direction (i.e., the z-direction).

In the embodiment, as compared to the embodiment described with reference to FIGS. 1 to 3, regions of the first and second resistance change layers 312z and 314z and the first and second gate insulation layers 322z and 324z substantially overlapped in the x-direction by the first to fourth gate line structures 22, 24, 26 and 28 may be separated from each other along the first direction (i.e., the z-direction). That is, the regions of the resistance change layers 312z and 314z in which signal information is stored in the nonvolatile memory device 5 can be distinguished from each other along the first direction (i.e., the z-direction) for each memory cell. Accordingly, within the same gate line structure, the gate voltage applied to a portion of the resistance change layer of a first memory cell generates an electric field that does not interfere with the portion of the resistance change layer of a different memory cell located above or below the first memory cell along the first direction (i.e., the z-direction). As a result, the above-described first to fifth interlayer insulation layer patterns 1132a, 1132b, 1132c, 1132d, 1132e, 1134a, 1134b, 1134c, 1134d and 1134e of the first and second channel structures 1012 and 1014 are configured to improve the reliability of signal information stored for each memory cell in the nonvolatile memory device.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A nonvolatile memory device comprising:
a substrate having an upper surface;
a channel structure disposed over the substrate, the channel structure comprising at least one channel layer pattern and at least one interlayer insulation layer pattern, which are alternately stacked in a first direction perpendicular to the upper surface, wherein the channel structure extends in a second direction perpendicular to the first direction;
a resistance change layer disposed over the substrate and on at least a portion of one sidewall surface of the channel structure;
a gate insulation layer disposed over the substrate and on the resistance change layer; and
a plurality of gate line structures disposed over the substrate, each contacting a first surface of the gate insulation layer,
wherein each of the plurality of gate line structures is disposed to be spaced apart from each other in the second direction.

2. The nonvolatile memory device of claim 1, wherein each of the plurality of gate line structures is disposed to overlap portions of the resistance change layer that correspond to the at least one channel layer pattern in a third direction perpendicular to the first and the second direction.

3. The nonvolatile memory device of claim 1, wherein each of the plurality of gate line structures has a pillar shape.

4. The nonvolatile memory device of claim 1, wherein the resistance change layer comprises an oxide having oxygen vacancies, and
wherein the oxide is at least one oxide selected from the group consisting of titanium oxide, aluminum oxide, nickel oxide, copper oxide, zirconium oxide, manganese oxide, hafnium oxide, tungsten oxide, tantalum oxide, niobium oxide, and iron oxide.

5. The nonvolatile memory device of claim 1, wherein the resistance change layer comprises at least one selected from the group consisting of PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr)$MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, and $YB_{a2}Cu_3O_7$.

6. The nonvolatile memory device of claim 1, wherein the resistance change layer comprises at least one selected from the group consisting of germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $GexSe_{1-x}$ ($0<x<1$), silver sulfide ($Ag_2S$), copper sulfide ($Cu_2S$), Cadmium sulfide (CdS), zinc sulfide (ZnS), and selenium oxide ($CeO_2$).

7. The nonvolatile memory device of claim 1, wherein the channel layer comprises a semiconductor material or a metal oxide.

8. The nonvolatile memory device of claim 1, wherein the resistance change layer is disposed to cover a sidewall surface of the channel layer pattern and a sidewall surface of the interlayer insulation layer pattern.

9. The nonvolatile memory device of claim 1, further comprising a plurality of insulation structures disposed over the substrate and arranged to alternate with the plurality of gate line structures along the second direction, the plurality of insulation structures extending in the first direction.

10. The nonvolatile memory device of claim 9, wherein each of the plurality of insulation structures is disposed to contact the channel structure in a third direction perpendicular to the first and second directions and is disposed to contact the plurality of gate line structures, the resistance change layer and the gate insulation layer in the second direction.

11. The nonvolatile memory device of claim 9, wherein the channel layer pattern of the channel structure contacts the resistance change layer in the third direction, and the interlayer insulation layer pattern of the channel structure contacts the plurality of gate line structures and the plurality of insulation structures in the third direction.

12. A nonvolatile memory device comprising:
a substrate having an upper surface;
a first channel structure and a second channel structure disposed over the substrate, each comprising at least one channel layer pattern and at least one interlayer insulation layer pattern, which are alternately stacked in a first direction perpendicular to the upper surface, and each extending in a second direction perpendicular to the first direction, wherein the first channel structure and the second channel structure are spaced apart from each other in a third direction perpendicular to the first and second directions;
a first resistance change layer and a first gate insulation layer sequentially disposed on a sidewall surface of the first channel structure along the third direction;
a second resistance change layer and a second gate insulation layer sequentially disposed on a sidewall surface of the second channel structure along the third direction; and
a plurality of gate line structures disposed over the substrate and disposed between the first channel structure and the second channel structure and extending in the first direction,
wherein each of the plurality of gate line structures is spaced apart from each other along the second direction.

13. The nonvolatile memory device of claim 12, wherein each of the plurality of gate line structures is disposed to electrically cover portions of the resistance change layer that correspond to the at least one channel layer pattern.

14. The nonvolatile memory device of claim 12, wherein each of the plurality of gate line structures has a pillar shape.

15. The nonvolatile memory device of claim 12, further comprising a plurality of insulation structures disposed over the substrate and arranged to alternate with the plurality of gate line structures along the second direction, the plurality of insulation structures extending in the first direction.

16. The nonvolatile memory device of claim 15, wherein each of the plurality of insulation structures is disposed to contact the channel structure in a third direction perpendicular to the first and second directions, and is disposed to contact the plurality of gate line structures, the first and second resistance change layers, and the first and second gate insulation layers in the second direction.

17. The nonvolatile memory device of claim 15, wherein the channel layer patterns of the first and second channel structures contact the first and second resistance change layers, respectively, in the third direction, and the interlayer insulation layer patterns of the first and second channel structure contact the gate line structures and the insulation structure in the third direction.

* * * * *